US008866950B2

(12) United States Patent
Yokogawa

(10) Patent No.: US 8,866,950 B2
(45) Date of Patent: Oct. 21, 2014

(54) IMAGING DEVICE AND IMAGING APPARATUS HAVING PLASMON RESONATOR

(75) Inventor: Sozo Yokogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 365 days.

(21) Appl. No.: 13/137,596

(22) Filed: Aug. 29, 2011

(65) Prior Publication Data

US 2012/0057055 A1 Mar. 8, 2012

(30) Foreign Application Priority Data

Sep. 8, 2010 (JP) ................................. 2010-200733

(51) Int. Cl.
*H04N 5/225* (2006.01)
*H04N 9/04* (2006.01)
*H01L 27/146* (2006.01)

(52) U.S. Cl.
CPC .......... *H01L 27/14627* (2013.01); *H04N 9/045* (2013.01); *H01L 27/14621* (2013.01); *H01L 27/14645* (2013.01)
USPC ......................................... 348/340; 348/308

(58) Field of Classification Search
None
See application file for complete search history.

(56) References Cited

U.S. PATENT DOCUMENTS

| 2005/0218303 | A1* | 10/2005 | Poplin | 250/214 AL |
|---|---|---|---|---|
| 2005/0286887 | A1* | 12/2005 | Uenaka et al. | 396/322 |
| 2006/0152610 | A1* | 7/2006 | Voronov et al. | 348/294 |
| 2006/0274189 | A1* | 12/2006 | Mouli | 348/340 |
| 2008/0087800 | A1 | 4/2008 | Toda | |
| 2008/0150057 | A1 | 6/2008 | Lee et al. | |
| 2008/0170143 | A1* | 7/2008 | Yoshida | 348/294 |
| 2009/0141343 | A1* | 6/2009 | Leard | 359/359 |
| 2009/0146198 | A1* | 6/2009 | Joe et al. | 257/292 |
| 2009/0190005 | A1* | 7/2009 | Mo et al. | 348/241 |
| 2010/0271516 | A1* | 10/2010 | Lee | 348/294 |
| 2011/0176048 | A1* | 7/2011 | Rockley | 348/340 |

FOREIGN PATENT DOCUMENTS

| EP | 1 198 126 A2 | 4/2002 |
|---|---|---|
| JP | 2008-177191 | 7/2008 |
| WO | WO-2008/082569 | 7/2008 |

OTHER PUBLICATIONS

Extended European Search Report issued Mar. 5, 2013 for corresponding European Application 11 17 9014.
Johansen, Knut et al. "Imaging Surface Plasmon Resonance Sensor Based on Multiple Wavelengths: Sensitivity Considerations" Review of Scientific Instruments, AIP, Melville, NY US, vol. 71, No. 9., Sep. 1, 2000, pp. 3530-3538, XP012038519, ISSN: 0034-6748, DIIL 10.1063/1.1287631, Figure 11.
N. Kashikawa et al., "FOCAS: The Faint Object Camera and Spectrograph for the Subaru Telescope," PASJ: Publ. Astron. Soc. Japan 54, pp. 819-832, Dec. 25, 2022.
S. Koyama et al., "Day-and-Night Imager for Security Monitoring Cameras," Panasonic Technical Journal vol. 54 No. 4, pp. 19-23, Jan. 2009.

* cited by examiner

*Primary Examiner* — Dennis Hogue
(74) *Attorney, Agent, or Firm* — Rader, Fishman & Grauer PLLC

(57) ABSTRACT

An imaging device includes: an imaging area in which a plurality of pixels used to acquire an image are provided; a spectrum area in which a plurality of pixels used to acquire a color spectrum are provided; and a filter that is formed above the pixels provided in the spectrum area and allows an electromagnetic wave with a desired wavelength to pass, wherein the filter is formed of a plasmon resonator that is a conductive metal structure having an unevenness structure at a predetermined pitch, and the imaging area and the spectrum area are provided on a single chip.

14 Claims, 17 Drawing Sheets

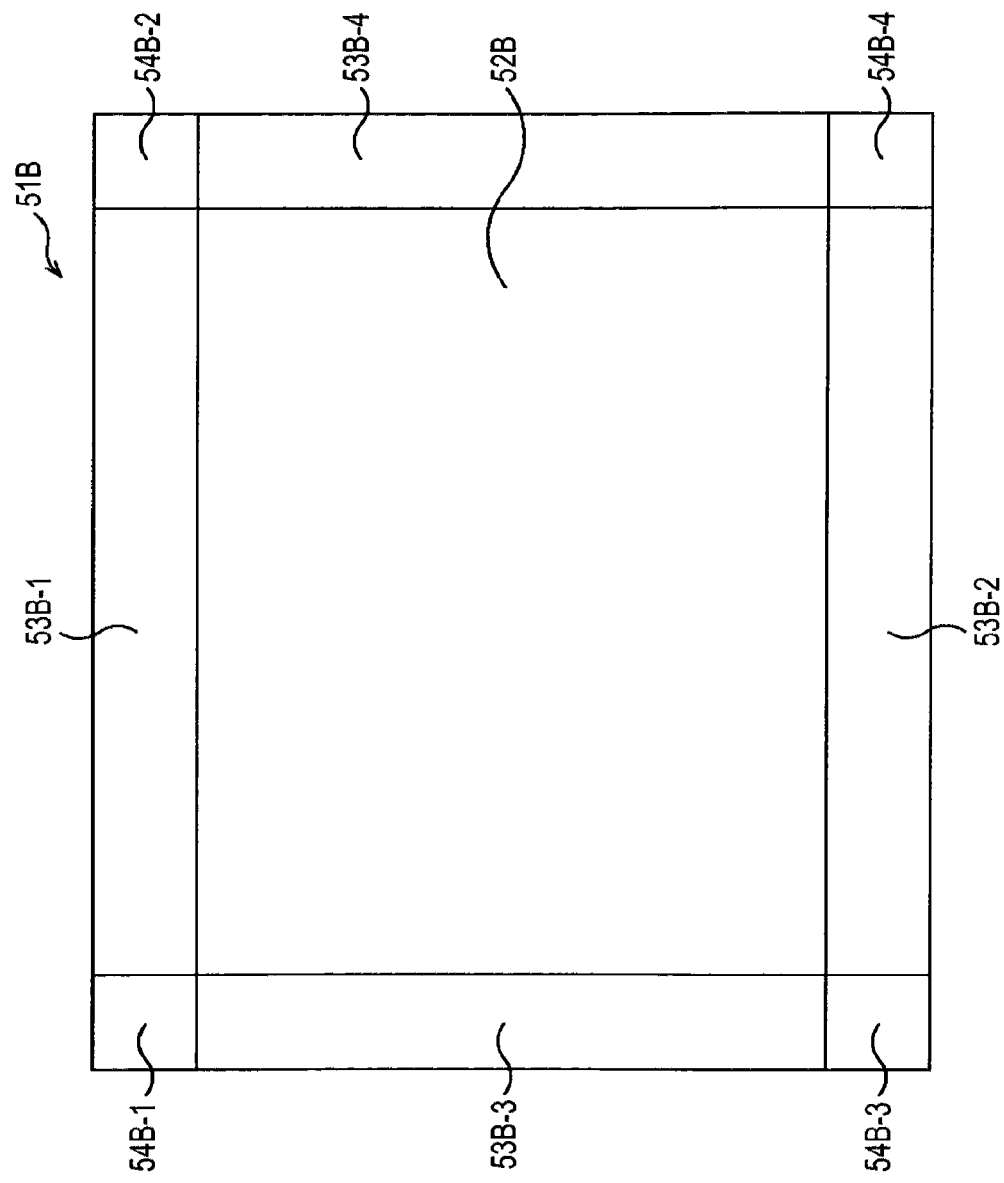

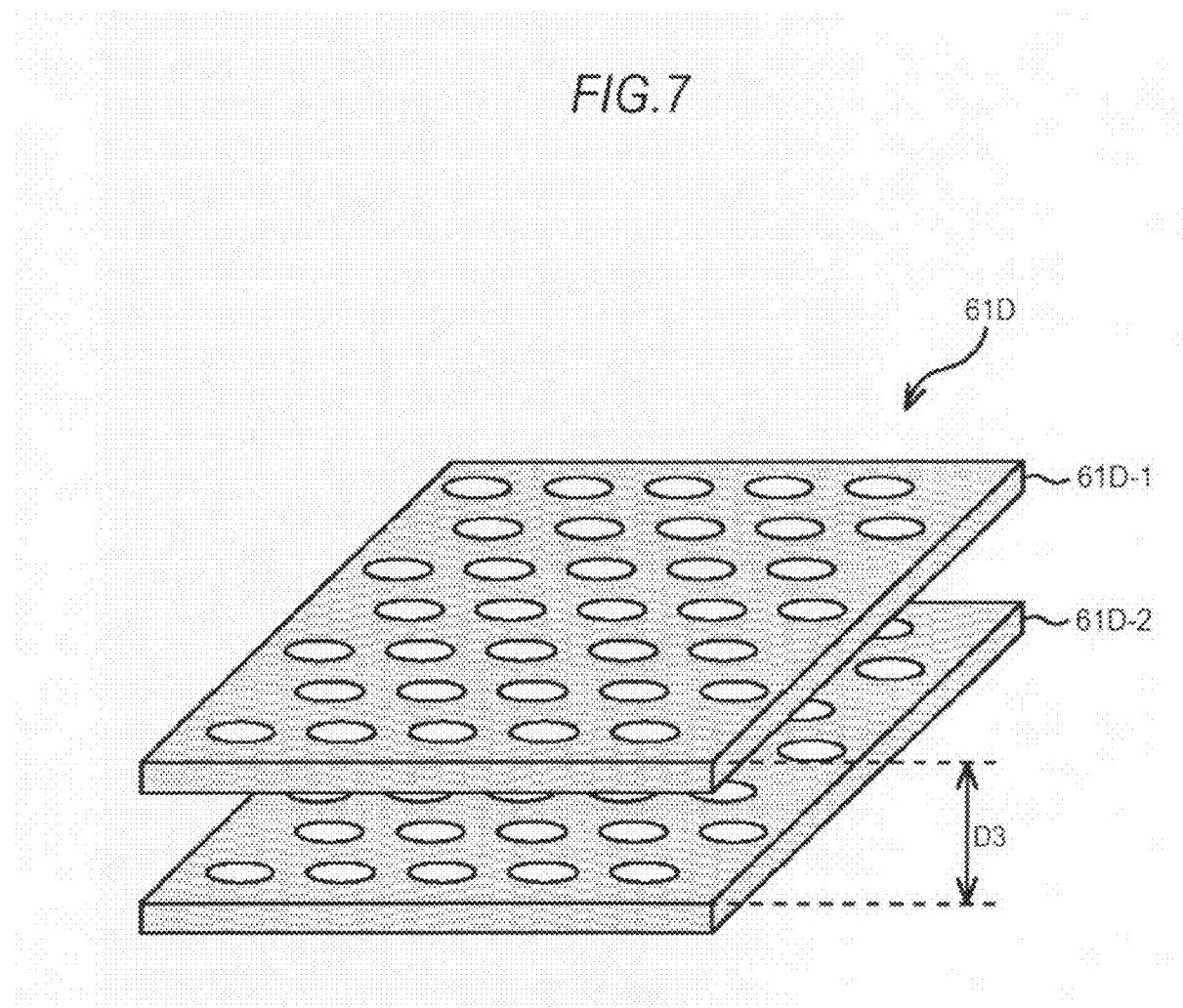

FIG.10

IMAGING DEVICE AND IMAGING APPARATUS HAVING PLASMON RESONATOR

FIELD

The present disclosure relates to an imaging device and an imaging apparatus, and more particularly, to an imaging device and an imaging apparatus capable of realizing high functionality with a simple structure.

BACKGROUND

In the related art, a CCD (Charge Coupled Device) type or CMOS (Complementary Metal Oxide Semiconductor) type solid-state imaging device is mainly employed as an electronic device, such as a digital still camera, a camcorder, and a mobile information terminal, that takes an image of a photography subject. A number of such solid-state imaging devices are formed of a pixel array in which one million or more pixels are 2-dimensionally arranged, each pixel accumulates signal charges according to the light intensity from the photography subject, and an electrical signal according to the amount of accumulated charges is sampled and imaged as an analog or digital data.

However, generally, the solid-state imaging device has sensitivity in a specific electromagnetic wave wavelength band. For example, a solid-state imaging device based on silicon has sensitivity with respect to a wavelength shorter than that of a near-infrared ray (to 1.1 μm). However, the silicon-based solid-state imaging device has no energy resolution (wavelength resolution) with respect to electromagnetic waves, and it is difficult to specify a wavelength of detected light from the accumulated charges.

In a general color imaging device, 2-dimensionally arranged pixels are provided with various kinds of on-chip color filters allowing a specific wavelength component to selectively pass, to acquire a color image. A method of acquiring light intensity information of a plurality of wavelengths from a small number of adjacent pixel groups, and restoring the color image by an interpolation process based on demosaicing is employed.

In a general purpose camera, a Bayer method is common in which on-chip color filters of three primary colors of RGB are arranged in a houndstooth shape in units of 2×2 pixels. To raise sensitivity, a part of pixels may be provided with white pixels (pixels passing all visible wavelength bands), may be provided with complementary color filters of cyan, magenta, yellow, and the like, or may be provided with pixels detecting near-infrared rays.

Such filters may contain organic molecules such as pigments. However, the color filter formed of organic molecules has low wavelength resolution, it is difficult to perform optimization for a specific narrowband wavelength, and thus there is a limit in multi-color. A problem that transmission characteristics deteriorate due to interannual change caused by external stimuli, such as ultraviolet rays is pointed out (e.g., see Panasonic Technical Report, Vol. 54, No. 4, January 2009, p. 18 to 23).

Meanwhile, there is a solid-state imaging device acquiring delicate color information invisible to the naked eye. For example, in a special camera for medical use, science study, or and the like, it is insufficient to only coarsely separate visible wavelengths into three colors and to capture them, and it is necessary to capture seamless spectrum information with high wavelength resolution. To cope with such a usage, an imaging device having high wavelength resolution is proposed. For example, in a spectrum sensor using diffractive grating, it is possible to acquire color spectrum with very high wavelength resolution such as wavelength resolution ($\lambda/\Delta\lambda$) over 100, but the size of the device is large and thus it is limited to a special usage (e.g., see PASJ Vol. 54, No. 6, p. 819 to 832).

However, a hole array structure of periodically disposing holes having the same extent as a detection wavelength or more minute than that in a conductive thin film, or an island array structure which is in negative and positive relation with the same structure, is known as a plasmon resonator structure. The plasmon resonator structure which optimizes period of hole or island pitches, openings, dot shapes, and the like serves as a filter capable of adjusting a transmission wavelength by a physical structure (e.g., see Ebbesen, T. W. et al., Nature, Volume 391, Issue 6668, pp. 667 to 669, 1998, and P. B. Catrysse & B. A. Wandell, J.Opt.Soc.Am.A, Vol. 20, No. 12, p. 2293 to 2306, 2003).

For example, in JP-A-2008-177191 and International Publication No. 2008/082569 Pamphlet, a technique using the plasmon resonator structure as a color filter is disclosed.

SUMMARY

However, the solid-state imaging device provided with the color filter technique disclosed in JP-A-2008-177191 and International Publication No. 2008/082569 Pamphlet is based on the assumption of a dedicated sensor. That is, the plasmon resonator structure is a structure having a spectrum function by a structure provided with repeated cycle structures of a specific pitch such as $\lambda/2$ or $\lambda/4$ of electromagnetic wavelengths, and thus it is not suitable to apply it to pixels which are made minute to the same extent as the wavelength.

That is, the plasmon resonator structure is applied only to a solid-state imaging device, the pixel size is several times larger than the electromagnetic wavelengths in the present situation.

When the solid-state imaging device only for spectrum is additionally mounted on a system provided with an imaging apparatus such as a digital still camera, a camcorder, and a mobile information terminal, a plurality of imaging devices are mounted on one imaging system. Accordingly, it is not practical from the viewpoint of redundancy of the system.

An image device provided with a added-value imaging device having a spectrum function of acquiring color spectrum information in addition to the general imaging function does not come into wide use.

Thus, it is desirable to provide an imaging device and an imaging apparatus with high functionality with a simple structure.

An embodiment of the present disclosure is directed to an imaging device including: an imaging area in which a plurality of pixels used to acquire an image are provided; a spectrum area in which a plurality of pixels used to acquire a color spectrum are provided; and a filter that is formed above the pixels provided in the spectrum area and allows an electromagnetic wave with a desired wavelength to pass, wherein the filter is formed of a plasmon resonator that is a conductive metal structure having an unevenness structure at a predetermined pitch, and the imaging area and the spectrum area are provided on a single chip.

Another embodiment of the present disclosure is directed to an imaging apparatus including an imaging device including an imaging area in which a plurality of pixels used to acquire an image are provided, a spectrum area in which a plurality of pixels used to acquire a color spectrum are provided, and a filter that is formed above the pixels provided in the spectrum area and allows an electromagnetic wave with a desired wavelength to pass, wherein the filter is formed of a plasmon resonator that is a conductive metal structure having an unevenness structure at a predetermined pitch, and the imaging area and the spectrum area are provided on a single chip.

In the embodiments of the present disclosure, the filter is configured by a plasmon resonator that is a conductive metal structure having an unevenness structure at a predetermined pitch, and the imaging area and the spectrum area are provided on a single chip.

According to the embodiments of the present disclosure, it is possible to achieve the high function with the simple structure.

BRIEF DESCRIPTION OF THE DRAWINGS

FIG. 5 is a diagram illustrating an example of still another configuration of a pixel area of an imaging device according to the embodiment of the present disclosure.

FIG. 7 is a diagram illustrating a structure of a plasmon filter configured by a 2-layer plasmon resonator.

FIG. 10 is a diagram illustrating a first example of arrangement of a plasmon filter.

DETAILED DESCRIPTION

Hereinafter, specific embodiments of the present disclosure will be described in detail with reference to the drawings.

Figure 1:
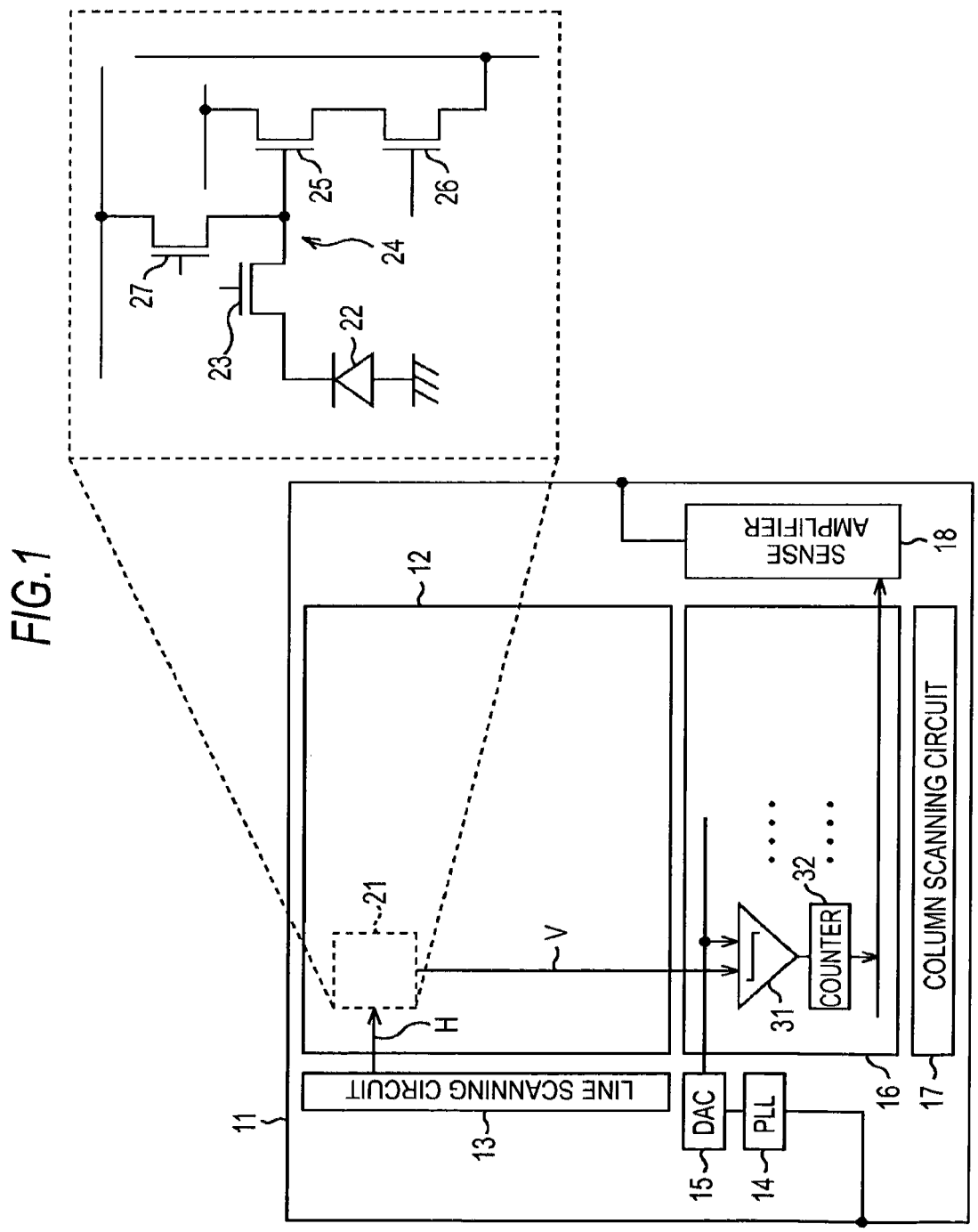
FIG. 1 is a block diagram illustrating an example of a configuration of an imaging device according to an embodiment of the present disclosure.

FIG. 1 is a block diagram illustrating an example of a configuration of an imaging device according to an embodiment of the present disclosure.

In FIG. 1, the imaging device 11 is a CMOS type solid-state imaging device, and includes a pixel array 12, a line scanning circuit 13, a PLL (Phase Locked Loop) 14, a DAC (Digital Analog Converter) 15, a column ADC (Analog Digital Converter) circuit 16, a column scanning circuit 17, and a sense amplifier 18.

The pixel array 12 has a plurality of 2-dimensionally arranged pixels 21. A pixel 21 is provided at the point at which a horizontal signal line H connected to the line scanning circuit 13 and a vertical signal line V connected to the column ADC circuit 16 intersect each other, and is formed of photo diodes for photoelectric conversion and various transistors for reading accumulated signals.

That is, as enlarged and shown on the right side of FIG. 1, the pixel 21 includes a photo diode 22, a transmission transistor 23, a floating diffusion 24, an amplification transistor 25, a selection transistor 26, and a reset transistor 27.

Charges accumulated in the photo diode 22 are transmitted to the floating diffusion 24 through the transmission transistor 23. The floating diffusion 24 is connected to a gate of the amplification transistor 25. When the pixel 21 is a signal reading target, the selection transistor 26 is turned on from the line scanning circuit 13 through the horizontal signal line H, and a signal of the selected pixel 21 is read from the vertical signal line V as a pixel signal corresponding to the amount of charges accumulated in the photo diode 22 by driving the amplification transistor 25 in a source follower manner. The reset transistor 27 is turned on to reset the pixel signal.

The line scanning circuit 13 outputs driving signals for driving (transmitting, selecting, resetting, and the like) the pixels 21 of the pixel array 12, sequentially for each line. The PLL 14 generates and outputs a clock signal of a predetermined frequency necessary to drive each block in the imaging device 11 on the basis of a clock signal supplied from the outside. The DAC 15 generates and outputs a lamp signal of a form (substantially, a saw-tooth form) in which voltage drops down from a predetermined voltage value in a regular slope and then returns to the predetermined voltage value.

The column ADC circuit 16 includes a number of comparators 31 and counters 32 corresponding to the number of columns of the pixels 21 of the pixel array 12, extracts signal levels from the pixel signals output from the pixels 21 by a CDS (Correlated Double Sampling) operation, and outputs pixel data. That is, the comparator 31 compares the lamp signal supplied from the DAC 15 with the pixel signal (brightness value) output from the pixel 21, and supplies a comparison result signal obtainable as a result to the counter 32. The counter 32 counts a counter clock signal of a predetermined frequency according to the comparison result signal output from the comparator 31 to perform A/D conversion of the pixel signal.

The column scanning circuit 17 sequentially supplies signals for outputting the pixel data to the counter 32 of the column ADC circuit 16 at a predetermined timing. The sense amplifier 18 amplifies the pixel data supplied from the column ADC circuit 16, and outputs it to the outside of the imaging device 11.

The image data output from the imaging device 11 is intensity information of colors of mosaic RGB, and thus the color information at all the pixel positions is interpolated from intensity information of adjacent different color pixels at each pixel position by a demosaic process in a latter-stage signal processing circuit or the like. The image data is subjected to a data process such as white balance, gamma correction, outline highlight, and image compression. When the imaging device 11 is a system on-chip image sensor provided with an image processor, such a process may be performed on the same chip. In this case, in addition to raw image data, image data compressed by JPEG (Joint Photographic Experts Group) or MPEG (Moving Picture Experts Group) may be output from the imaging device 11.

However, generally, in the imaging device 11, an image is constructed, not using pixel signals output from all the pixels 21 of the pixel array 12 but using pixel signals output from the pixels 21 in a partial area of the pixel array 12, to acquire the image. Hereinafter, an area where all the pixels 21 of the pixel array 12 are arranged is referred to as a total pixel area, and an area where the pixels 21 used to acquire the image are arranged is referred to as an imaging area (valid pixel area). In the area constituting the total pixel area, an area where the pixels 21 representing a black level are arranged is referred to as an optical black area, and a dummy area which does not contribute to a signal process is referred to as an invalid area.

A pixel area of a general 2-dimensional solid-state imaging device will be described with reference to FIG. 2.

Figure 2:
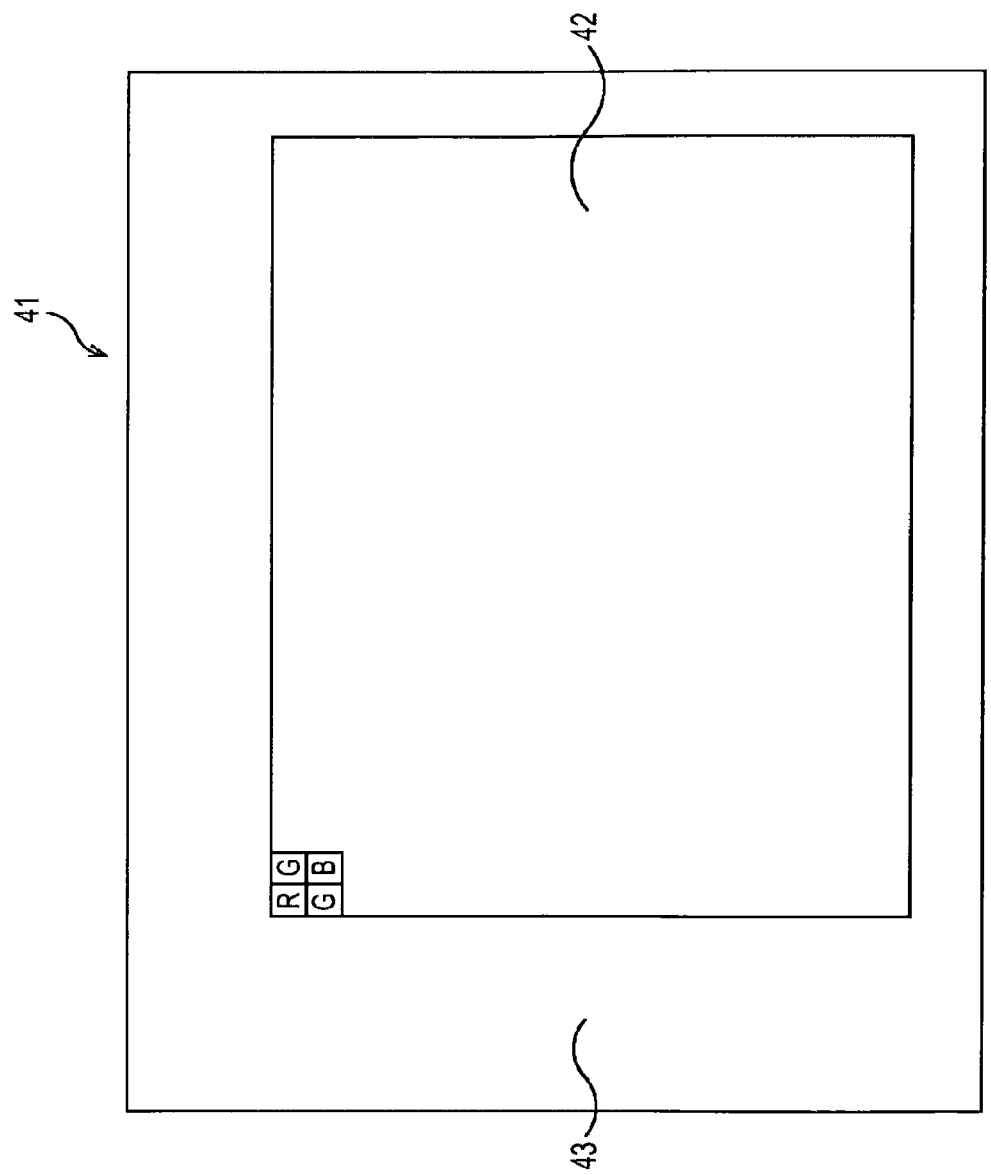
FIG. 2 is a diagram illustrating a pixel area of a general 2-dimensional solid-state imaging device.

FIG. 2 shows the imaging area 42 and the optical black area 43 of the area constituting the total pixel area 41, and does not show the invalid area. As shown in FIG. 2, the imaging area 42 occupies most of the center of the total pixel area 41, and the optical black area 43 occupies the periphery of the imaging area 42. In the imaging area 42 the on-chip color filter of three primary colors of RGB is provided in a so-called Bayer manner.

An image taken by such an imaging device is acquired by subtracting the signal of the optical black area 43 to cancel a noise component such as a pixel noise or a reading circuit noise from the pixel signal corresponding to the amount of charges accumulated in the imaging area 42. Generally, the optical black area 43 is a light shield structure in which the upside of the pixel structure is shielded by a metal thin film such as aluminum.

Next, the pixel area of the imaging device 11 according to the embodiment of the present disclosure will be described with reference to FIG. 3.

The total pixel area 51 of the imaging device 11 includes an imaging area 52, an optical black area 53, and spectrum areas 54-1 and 54-2. The spectrum areas 54-1 and 54-2 are areas for acquiring various kinds of color spectrums from the imaging area 52.

In the example of the configuration shown in FIG. 3, the imaging area 52 is provided at the center of the total pixel area 51, the spectrum area 54-1 is provided above the imaging area 52, and the spectrum area 54-2 is provided below the imaging area 52. The optical black area 53 is provided to surround the imaging area 52, the spectrum area 54-1, and the spectrum area 54-2.

Generally, an aspect ratio of the chip constituting the imaging device 11 is not 1:1, and the chip may be considered as a transverse shape imitating a view angle of human. On the contrary, a shape of light irradiated onto the imaging device 11 through an optical system formed of a lens group is circular as shown by the broken line. Since it is necessary to secure characteristics of even pixels of diagonal corners of the imaging area 52, the optical system is designed such that all the pixels of the imaging area 52 are irradiated with light.

Accordingly, on the short shaft side of the imaging area 52, there is an area (dead space) which is not used to acquire the image in spite of sufficient characteristics as an optical system. That is, the area (area hatched by the oblique lines in FIG. 3) irradiated with light in the spectrum areas 54-1 and 54-2 is not used to acquire the image, but is an area having sufficient characteristics as an optical system. That is, the pixels of the area may be used as a spectrum sensor.

Figure 3:
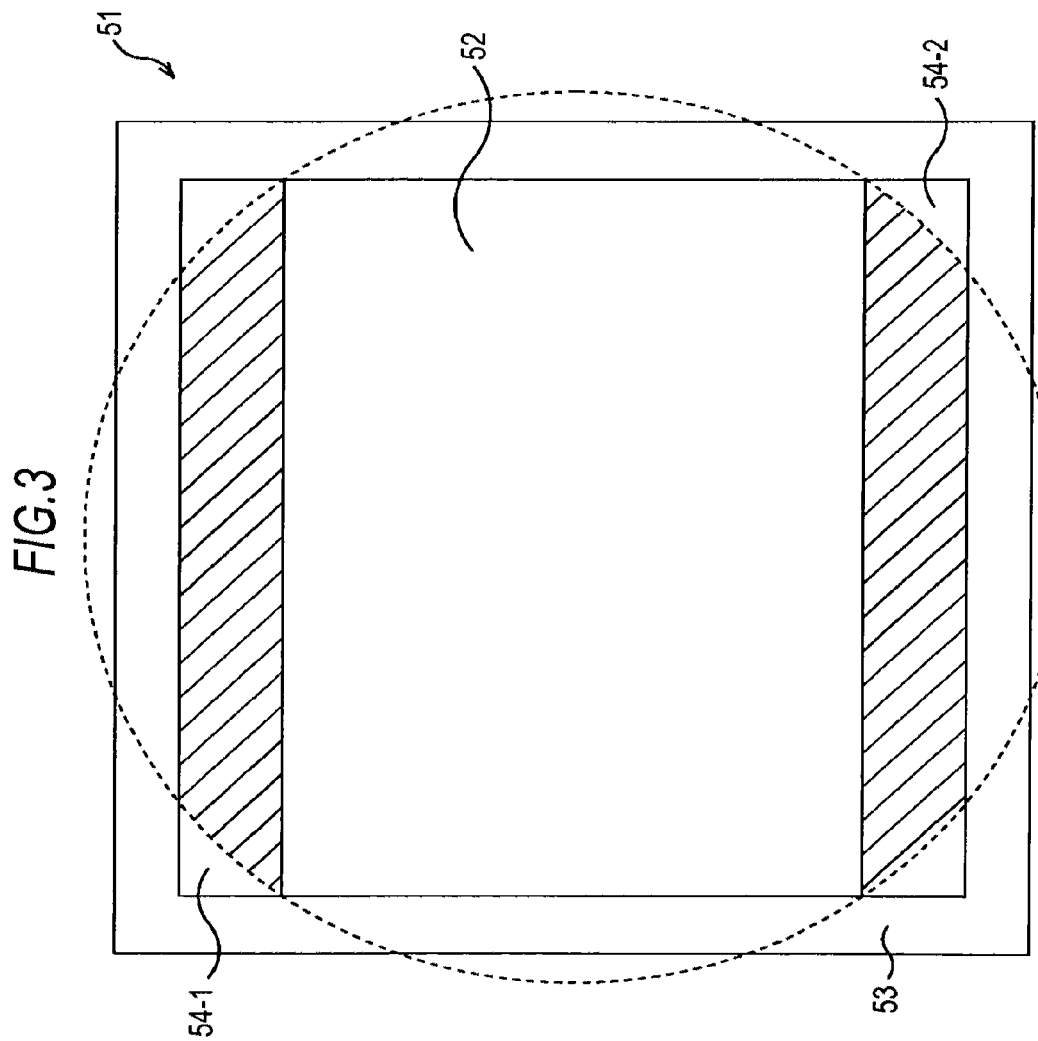
FIG. 3 is a diagram illustrating an example of a configuration of a pixel area of the imaging device according to the embodiment of the present disclosure.
Figure 4:
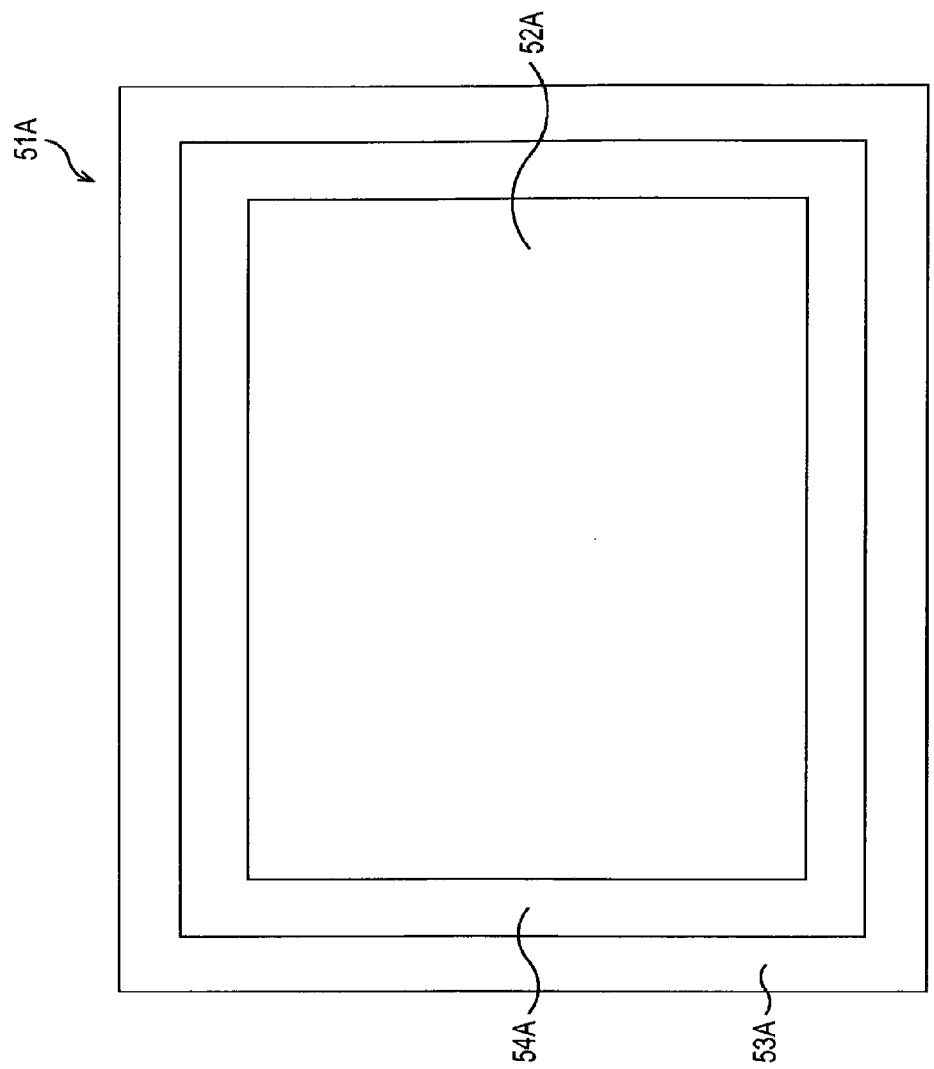
FIG. 4 is a diagram illustrating an example of another configuration of a pixel area of an imaging device according to the embodiment of the present disclosure.

The disposition of the spectrum area 54 is not limited to the example of the configuration shown in FIG. 3, and the imaging area 52 and the spectrum area 54 may be provided on a single chip. That is, in a total pixel area 51A shown in FIG. 4, a spectrum area 54A is provided to surround the outer periphery of an imaging area 52A, and an optical black area 53A is provided to surround the outer periphery of the spectrum area 54A. In a total pixel area 51B shown in FIG. 5, optical black areas 53B-1 to 53B-4 are provided on the upside, downside, left side, and right side of the imaging area 52B. In the imaging device in the related art, spectrum areas 54B-1 to 54B-4 are provided in four corners in the invalid area.

As described above, the spectrum area 54 may be provided in an arbitrary pixel area in the total pixel area 51, and particularly, is provided in an area in the vicinity of the imaging area 52 having sufficient characteristics as the optical system, to effectively use the optical characteristics of the lens, which is highly preferable.

In the imaging device 11 according to the embodiment of the present disclosure, a plasmon filter using a plasmon resonator as a filter is employed as a filter for performing spectrum on the spectrum area 54.

Next, a structure of the plasmon resonator used as the plasmon filter will be described with reference to FIGS. 6A to 6C.

The plasmon resonator is a sub-wavelength structure in which a minute process is performed on a thin film formed of a conductive material (specifically, silver, aluminum, or gold are highly preferable) having a plasma frequency in the ultraviolet wavelength band. The plasmon resonator has a resonance wavelength determined by the physical properties of the conductor, pattern cycle, opening size, dot size, film thickness, a medium around a structure, and the like. The basic structure of the plasmon resonator is a hole array structure, and is a structure in which holes (through-hole or non-through-hole) having a diameter smaller than a detection wavelength are 2-dimensionally arranged, and the holes are filled with a dielectric material. It is preferable that the holes are arranged in a honeycomb or orthogonal matrix, and a periodic structure in the other arrangement may be applied.

Figure 6A:
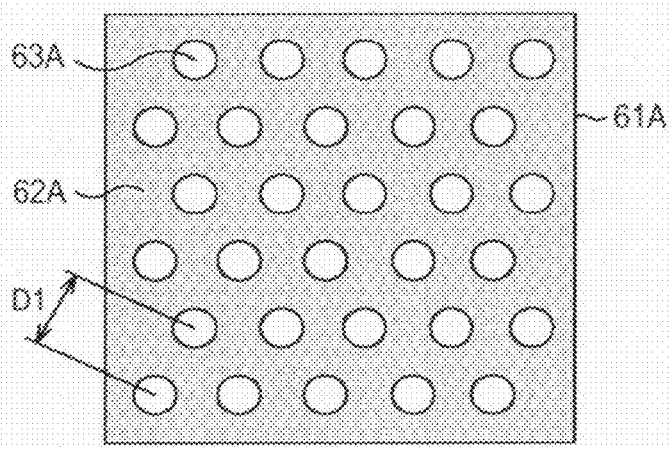
FIGS. 6A to 6C are diagrams illustrating a structure of a plasmon filter.

For example, a plasmon filter 61A shown in FIG. 6A is configured by a plasmon resonator in which through-holes 63A are arranged in a honeycomb shape in a conductive thin film 62A. A plasmon filter 61B shown in FIG. 6B is configured by a plasmon resonator in which through-holes 63B are arranged in an orthogonal matrix in a conductive thin film 62B.

The opening size of the through-holes 63A and 63B may be smaller than a wavelength of light to pass, and for example, a diameter of about 100 nm is highly preferable. The opening size of the through-holes 63A and 63B may be in the range of 10 nm to 200 nm considering the degree of freedom in design. The thickness of the conductive films 62A and 62B is very preferably about 100 nm, and may be in the range of 10 nm to 200 nm.

A distance D1 between the though-holes 63A adjacent to each other in the plasmon filter 61A is adjusted to set the transmission wavelength passing through the plasmon filter 61A. Similarly, a distance D2 between the through-holes 63B adjacent to each other in the plasmon filter 61B is adjusted to set the transmission wavelength passing through the plasmon filter 61B.

The distance D1 and the distance D2 are very preferably in the range of a half wavelength to one wavelength of an effective electromagnetic wavelength in a medium, and specifically, is preferably about 150 to 1000 nm.

In the plasmon resonator, it is not necessary that all the holes provided in the hole array structure pass through the conductive thin film, and the plasmon resonator serves as a filter even when a part of the holes are configured by non-through-holes having a concave structure on a conductor.

Figure 6B:
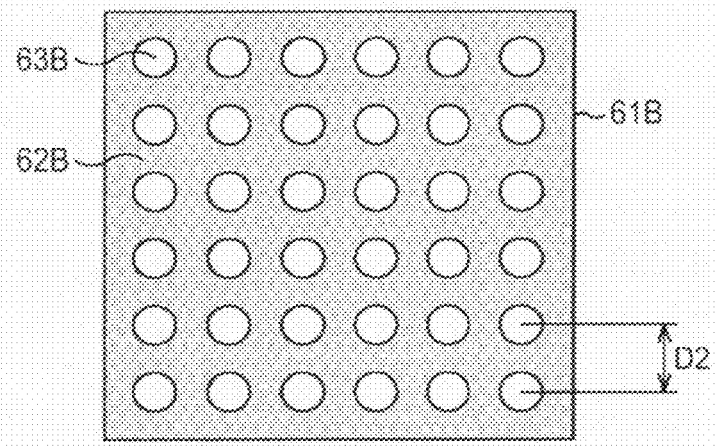
Figure 6C:
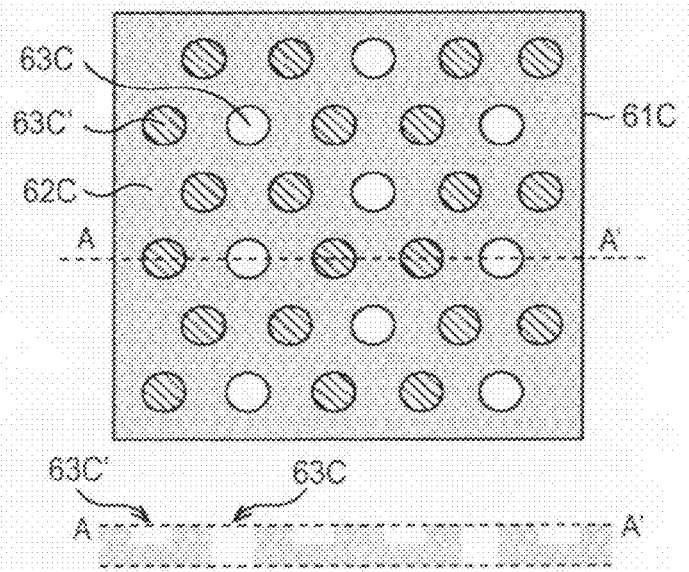

For example, FIG. 6C shows a plan view and a cross-sectional view (cross-sectional view of the lines A-A' in plan view) of a plasmon filter 61C configured by a plasmon resonator in which through-holes 63C and non-through-holes 63C' are arranged in a honeycomb shape in a conductive thin film 62C. That is, the plasmon filter 61C is configured such that the through-holes 63C and the non-through-holes 63C' are periodically arranged.

Basically, a single-layer plasmon resonator is used as the plasmon filter, but for example, it may be configured by a 2-layer plasmon resonator.

For example, a plasmon filter 61D shown in FIG. 7 is configured by 2-layer plasmon filters 61D-1 and 61D-2. The plasmon filters 61D-1 and 61D-2 have the structure in which the through-holes are arranged in the honeycomb shape in the same manner as the plasmon resonator constituting the plasmon filter 61A shown in FIG. 6A.

The distance D3 between the plasmon filter 61D-1 and the plasmon filter 61D-2 is very preferably a ¼ wavelength of the detection wavelength. Considering the degree of freedom in design, the distance D3 is more preferably a ½ wavelength or less of the detection wavelength.

Like the plasmon filter 61D, in addition to the disposition of the holes in the same pattern in the plasmon filters 61D-1 and 61D-2, for example, holes may be arranged in a pattern similar to the 2-layer plasmon resonator structure. In the 2-layer plasmon resonator structure, holes and islands maybe arranged in a pattern in which the hole array structure and the island array structure are reversed. The plasmon filter 61D is a 2-layer structure, but may be a multi-layered structure of three or more layers.

FIG. 6A to FIG. 7 shows the example of the configuration of the plasmon filter based on the plasmon resonator of the hole array structure, but a plasmon resonator of an island array structure may be employed as the plasmon filter.

The plasmon filter of the island array structure will be described with reference to FIGS. 8A and 8B.

Figure 8A:
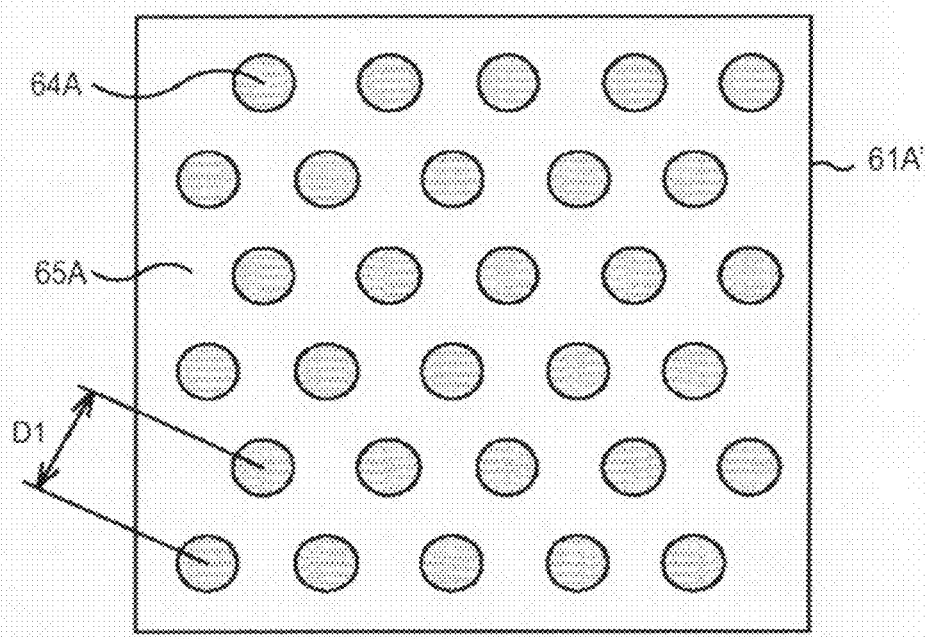
FIGS. 8A and 8B are diagrams illustrating a structure of a plasmon filter of an island array structure.

A plasmon filter 61A' shown in FIG. 8A is configured by a structure negatively and positively reversed with respect to the plasmon resonator of the plasmon filter 61A of FIG. 6A, that is, a plasmon resonator in which the islands 64A are arranged in the honeycomb shape in the dielectric layer 65A. Similarly, a plasmon filter 61B' shown in FIG. 8B is configured by a structure negatively and positively reversed with respect to the plasmon resonator of the plasmon filter 61B of FIG. 6B, that is, a plasmon resonator structure in which the islands 64B are arranged in an orthogonal matrix in the dielectric layer 65B.

The conductive islands 64A and 64B have a size of 20 nm to 200 nm. A space between the islands 64A is filled with a dielectric layer 65A, and a space between the islands 64B is filled with a dielectric layer 65B. A distance D1 between the adjacent islands 64A and a distance D2 between the adjacent islands 64B are very preferably a half wavelength of the effective electromagnetic wavelength in the medium similarly to the distances D1 and D2 shown in FIGS. 6A and 6B, and are very preferably in the range of a ¼ wavelength to one wavelength considering the degree of freedom in design.

To pass a desired electromagnetic wave, in addition to setting a pitch (distance D1 or D2) of the holes or islands of the plasmon filter, for example, a hole shape or an island shape may be optimized. As the hole shape or the island shape, for example, a circular shape, a tetragon shape (square or rectangle), a polygon, a cross shape, or the like is appropriately selected according to a simulation result or the like.

Figure 9A:
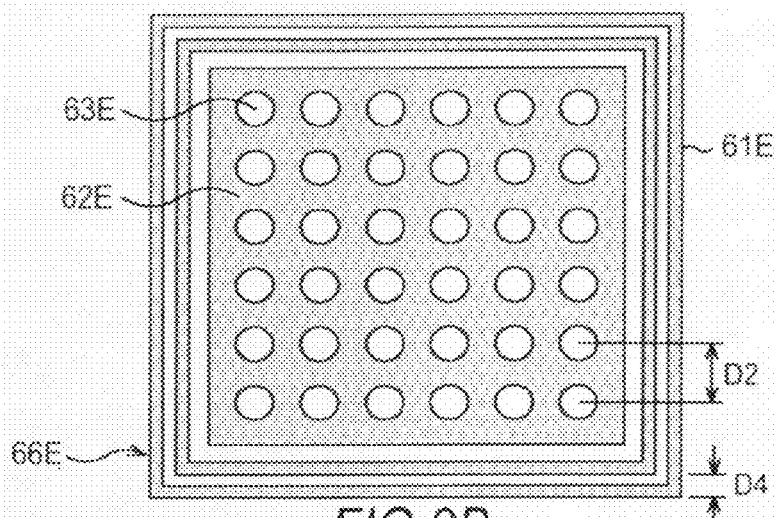
FIGS. 9A to 9C are diagrams illustrating another example of a plasmon filter using a plasmon resonator.
Figure 9B:
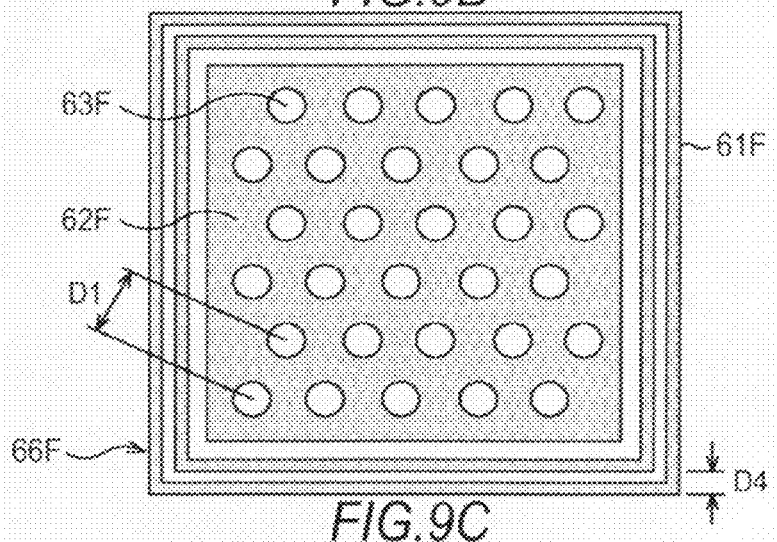
Figure 9C:
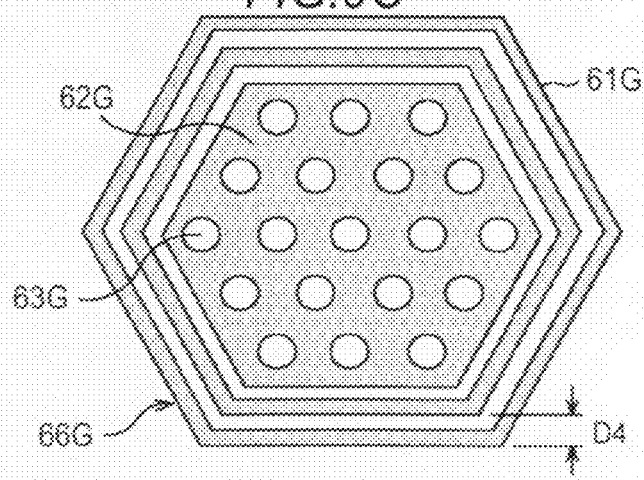

Next, FIGS. 9A to 9C are other examples of a plasmon filter using a plasmon resonator.

A plasmon filter 61E shown in FIG. 9A is configured by a plasmon resonator in which through-holes 63E are arranged in an orthogonal matrix in a conductive thin film 62E similarly to the plasmon filter 61B shown in FIG. 6B. The plasmon filter 61E has a configuration in which an outer peripheral portion of the area where the through-holes 63E are provided is surrounded with a Bragg mirror structure 66E. The Bragg mirror structure 66E is a multi-layer film formed by repeatedly laminating different kinds of materials. In an example of a configuration shown in FIGS. 9A to 9C, the Bragg mirror structure 66E is configured by a 2-layer conductive material (hatched area) and a 2-layer dielectric material (non-hatched area).

In the plasmon filter 61E, similarly to the distance D2 shown in FIG. 6B, the distance D2 between the through-holes 63E arranged in an orthogonal coordinate system is very preferably in the range of a half wavelength to one wavelength of the effective electromagnetic wavelength in the medium, and specifically, is preferably about 150 to 1000 nm. The distance D4 of the Bragg mirror structure 66E is preferably a half of the distance D2.

The plasmon filter 61F shown in FIG. 9B is configured by a plasmon resonator in which through-holes 63F are arranged in a honeycomb shape in a conductive thin film 62F, similarly to the plasmon filter 61A shown in FIG. 6A. The plasmon filter 61F has a configuration in which an outer peripheral portion of the area where the through-holes 63F are provided is surrounded with a Bragg mirror structure 66F.

In the plasmon filter 61F, similarly to the distance D1 shown in FIG. 6A, the distance D1 between the through-holes 63F arranged in the honeycomb shape is very preferably in the range of a half wavelength to one wavelength of the effective electromagnetic wavelength in the medium, and specifically, is preferably about 150 to 1000 nm. The distance D4 of the Bragg mirror structure 66F is preferably a half of the distance D1.

Like a plasmon filter 61G shown in FIG. 9C, through-holes 63G are arranged in a honeycomb shape in a conductive thin film 62G, an outer peripheral portion of the area where the through-holes 63G are provided may be surrounded with a hexagonal Bragg mirror structure 66G.

Like the plasmon filters 61E to 61G, the Bragg mirror structures 66E to 66G are provided to reduce mixing of plasmon between the adjacent pixels. Since it is possible to obtain a high resonance effect with a smaller periodic structure by the Bragg mirror structures 66E to 66G, it is highly preferable when reducing the filter size. The resonance effect in the Bragg mirror structure is the related art, and is disclosed in "Lab Chip, 2009, 9, 382 to 387, Nathan et al." structurally.

The plasmon filters 61A to 61G described with reference to FIG. 6A to FIG. 9C are provided in the spectrum area 54 shown in FIG. 3, and are used as to acquire color spectrum.

Figure 10:
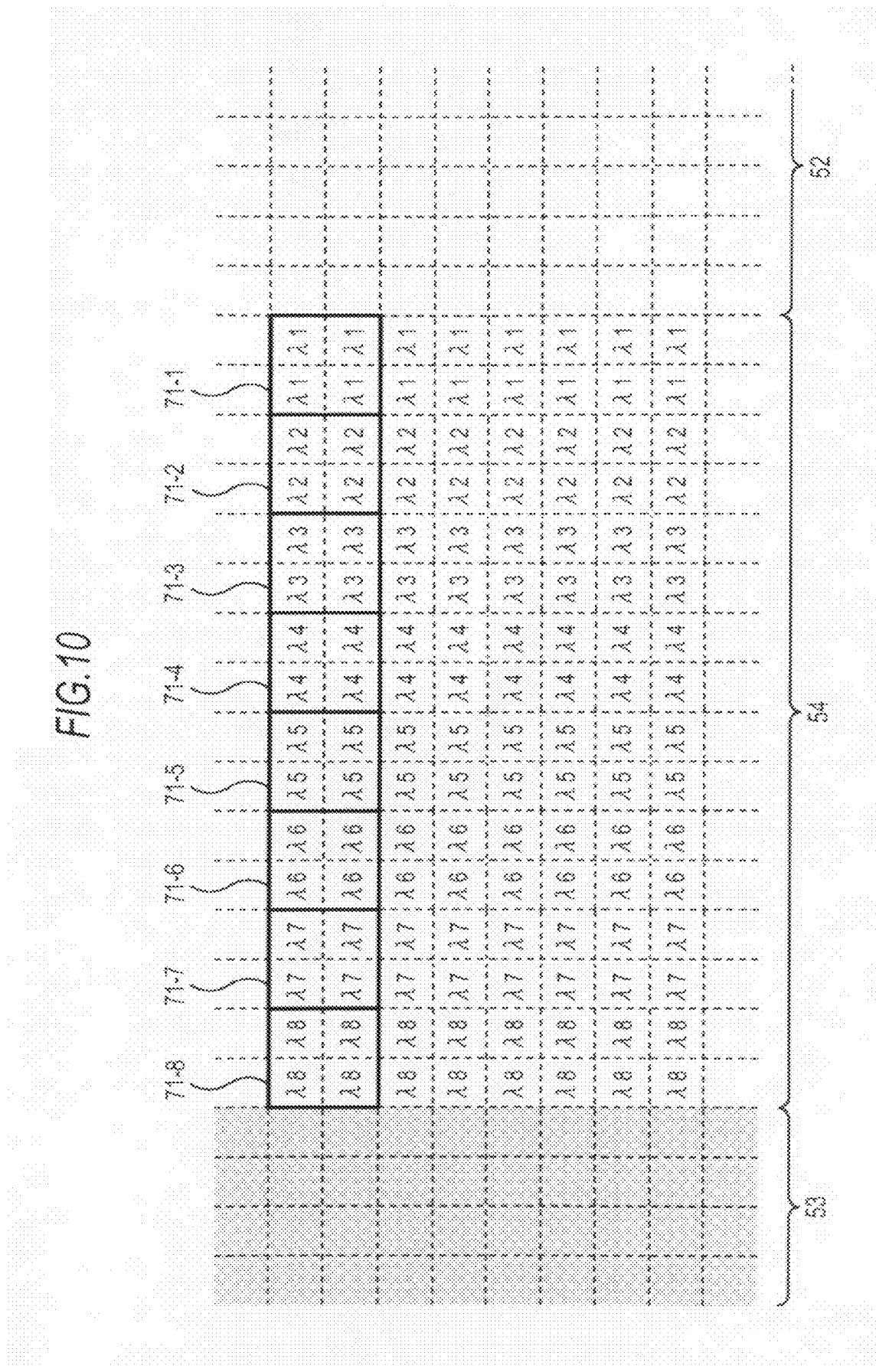

Next, FIG. 10 is a diagram illustrating a first example of arrangement of the plasmon filters.

In FIG. 10, the pixels 21 arranged in a matrix in the pixel array 12 are represented by broken lines. As described with reference to FIG. 3, the spectrum area 54 is provided adjacent to the imaging area 52 that is the area used to take an image, and the optical black area 53 is provided adjacent to the spectrum area 54.

In the plasmon filter, a wavelength (transmission wavelength) of light passing through the plasmon filter is set according to the basic pitch of the holes or islands constituting the plasmon resonator, for example, according to the distance D1 between the through-holes 63A shown in FIG. 6A. A grating coefficient X of the plasmon filter determined by the basic pitch is a grating coefficient $\lambda 1$, a grating coefficient $\lambda 2, \ldots$, and a grating coefficient $\lambda N$, in order from the short transmission wavelength side of the visible wavelength band.

It is basic that one pixel 21 corresponds to one kind of plasmon filter, that is, the pixel 21 and the plasmon filter have a 1 to 1 correspondence. However, the plurality of pixels 21 may correspond to one kind of plasmon filter. That is, in a plurality of pixel units of N×M, one kind or more kinds of plasmon filters may be arranged (N and M are an integer equal to or more than 1).

For example, in FIG. 10, in four pixel units of 2×2, one kind of plasmon filter is provided (i.e., N=2 and M=2). Hereinafter, the plasmon filter in which the plurality of pixels is provided as one unit is appropriately referred to as a plasmon filter unit.

In the spectrum area 54 shown in FIG. 10, 8 kinds of plasmon filter units 71-1 to 71-8 of the grating coefficients $\lambda 1$ to $\lambda 8$ are arranged. The plasmon filter units 71-1 to 71-8 may be arranged in one direction (direction from right end to left end of the spectrum area 54) in order of the size of the grating coefficient $\lambda$.

That is, the plasmon filter unit 71-1 of the grating coefficient $\lambda 1$ of the shortest transmission wavelength is provided adjacent to the imaging area 52. On the optical black area 53 side of the plasmon filter unit 71-1, the plasmon filter unit 71-2 of the grating coefficient $\lambda 2$ of the second shortest transmission wavelength is provided. Hereinafter, the plasmon filter units 71-3 to 71-7 are sequentially provided in order of the short transmission wavelength, and the plasmon filter unit 71-8 is provided adjacent to the optical black area 53.

As described above, the plasmon filter units 71, the grating coefficients $\lambda$ of which are not greatly different, are provided in the adjacent pixels, and thus the influence of discontinuance of periods at the boundary between the plasmon filter units 71 becomes the minimum to suppress the influence.

Figure 11:
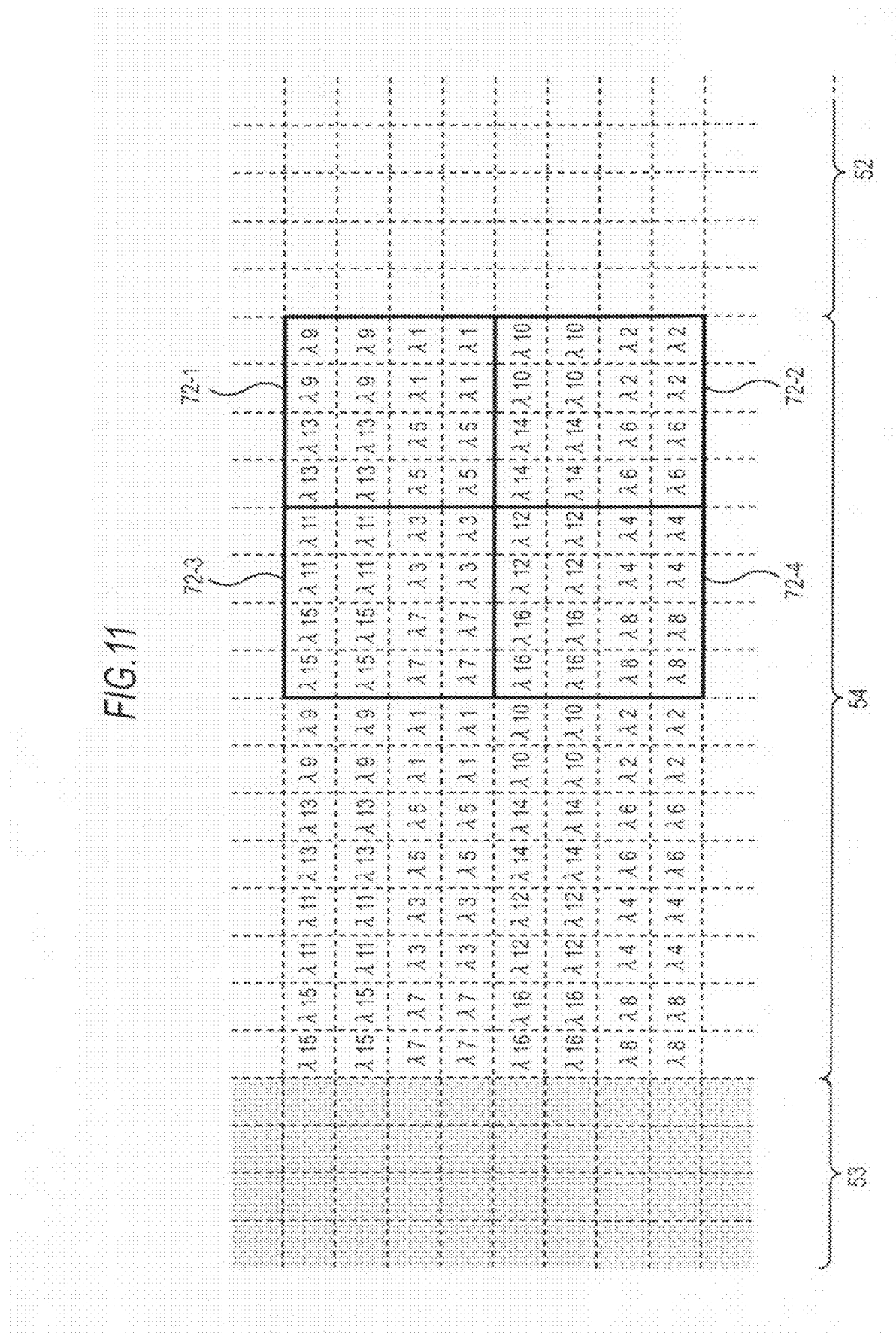
FIG. 11 is a diagram illustrating a second example of arrangement of a plasmon filter.

Next, FIG. 11 is a diagram illustrating a second example of arrangement of the plasmon filters.

In FIG. 11, the spectrum area 54 is provided adjacent to the imaging area 52 that is the imaging area used to take an image, and the optical black area 53 is provided adjacent to the spectrum area 54. In the second example of arrangement, the whole wavelength band is covered with blocks corresponding to N×M of the pixels represented by the broken lines (N and M are an integer equal to or more than 1).

In the example of arrangement shown in FIG. 11, in a case of the grating coefficient $\lambda 1$, the grating coefficient $\lambda 2, \ldots$, the grating coefficient $\lambda N$ in order from the short side of the transmission wavelength of the visible wavelength band, an example of N=16 is shown, and the visible wavelength band is covered with blocks corresponding to 4×4 of pixels. Four plasmon filter units in which one kind of plasmon filter is provided in four pixel units of 2×2 are combined to constitute a plasmon filter block.

That is, in the plasmon filter block 72-1, a plasmon filter unit of the grating coefficient $\lambda 1$, a plasmon filter unit of the grating coefficient $\lambda 5$, a plasmon filter unit of the grating coefficient $\lambda 9$, and a plasmon filter unit of the grating coefficient $\lambda 13$ are provided. In the plasmon filter block 72-2, a plasmon filter unit of the grating coefficient $\lambda 2$, a plasmon filter unit of the grating coefficient $\lambda 6$, a plasmon filter unit of the grating coefficient $\lambda 10$, and a plasmon filter unit of the grating coefficient $\lambda 14$ are provided. In the plasmon filter block 72-3, a plasmon filter unit of the grating coefficient $\lambda 3$, a plasmon filter unit of the grating coefficient $\lambda 7$, a plasmon filter unit of the grating coefficient $\lambda 11$, and a plasmon filter unit of the grating coefficient $\lambda 15$ are provided. In the plasmon filter block 72-4, a plasmon filter unit of the grating coefficient $\lambda 4$, a plasmon filter unit of the grating coefficient $\lambda 8$, a plasmon filter unit of the grating coefficient $\lambda 12$, and a plasmon filter unit of the grating coefficient $\lambda 16$ are provided.

As described above, the plasmon filter block is configured such that a partial group of the plasmon filter units corresponding to colors (transmission wavelengths) is provided at the adjacent position, and each partial group including four adjacent pixels has color information of four colors. As a result, it is possible to easily restore the color image by a complement process based on demosaicing. Accordingly, it is possible to suppress the deterioration of space resolution as compared with the case where the filter with the close wavelength band is provided at the near pixel.

Figure 12:
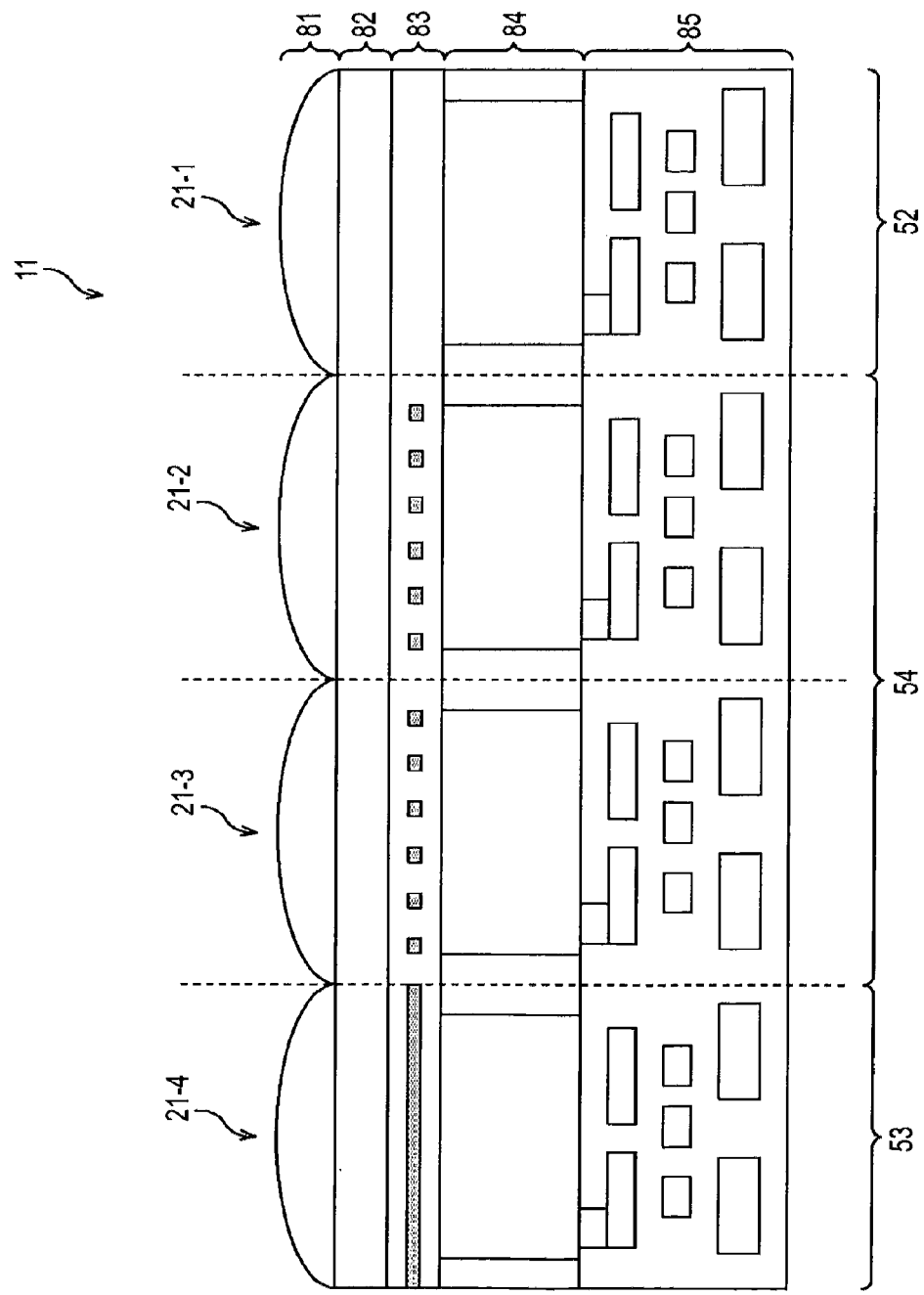
FIG. 12 is a cross-sectional schematic view of an imaging device.

Next, FIG. 12 is a cross-sectional schematic view of the imaging device 11.

In FIG. 12, the imaging device 11 has a configuration in which the pixels 21-1 of the imaging area 52, the pixels 21-2 and 21-3 of the spectrum area 54, and the pixel 21-4 of the optical black area 53 are adjacently provided. In FIG. 12, an example of a configuration employing a back-side irradiation CMOS-type solid-state imaging device is shown as the imaging device 11. However, a configuration in which a photoelectric conversion device portion is the CCD-type solid-state imaging device, or a photoconductor structure including an organic photoelectric conversion film or a quantum dot structure may be employed.

The pixels 21-1 to 21-4 are configured by laminating an on-chip micro lens 81, a color filter layer 82, a light shield area layer 83, a photoelectric conversion device layer 84, and a signal line layer 85 in order from the upside.

The on-chip micro lens 81 is an optical device for collecting light on the photoelectric conversion device layer 84 of the pixels 21-1 to 21-4. The color filter layer 82 is an optical device for obtaining a color image by the pixel 21-1 in the imaging area 52.

The light shield area layer 83 has a dielectric material, such as aluminum or tungsten, having a light shielding property. In the optical black area 53, the whole opening portion of the pixel 21-4 is shielded by the light shield area layer 83. In the spectrum area 54, the dielectric material is provided in the hole array structure or the island array structure described above, and the light shield area layer 83 serves as a plasmon filter.

The photoelectric conversion device layer 84 converts the received light into charges. The photoelectric conversion device layer 84 has a configuration in which the pixels 21-1 to 21-4 are electrically separated by a device separating layer. On the signal line layer 85, lines for reading the charges accumulated in the photoelectric conversion device layer 84 are provided.

As described above, in the imaging device 11, the light shield area layer 83 has both of a function of shielding light in the optical black area 53 and a function as a spectrum filter in the spectrum area 54.

In the imaging device 11, since the imaging area 52 and the spectrum area 54 are provided in a single chip, the spectrum function of acquiring the color spectrum can be realized with a simple structure, in addition to a general color imaging function. Accordingly, the imaging device 11 can be inexpensively produced as compared with the case of providing a sensor only for spectrum.

Since the plasmon filter is employed as the color filter provided in the spectrum area 54, it is possible to acquire more kinds of color spectrum than the imaging area 52 only by adjusting the pitch.

Since the light shield film in the optical black area 53 and the plasmon filter in the spectrum area 54 are mounted on the same light shield area layer 83 with the same material, it is possible to produce the plasmon filter with less change and a smaller number of processes than the production process of the related art.

Figure 13:
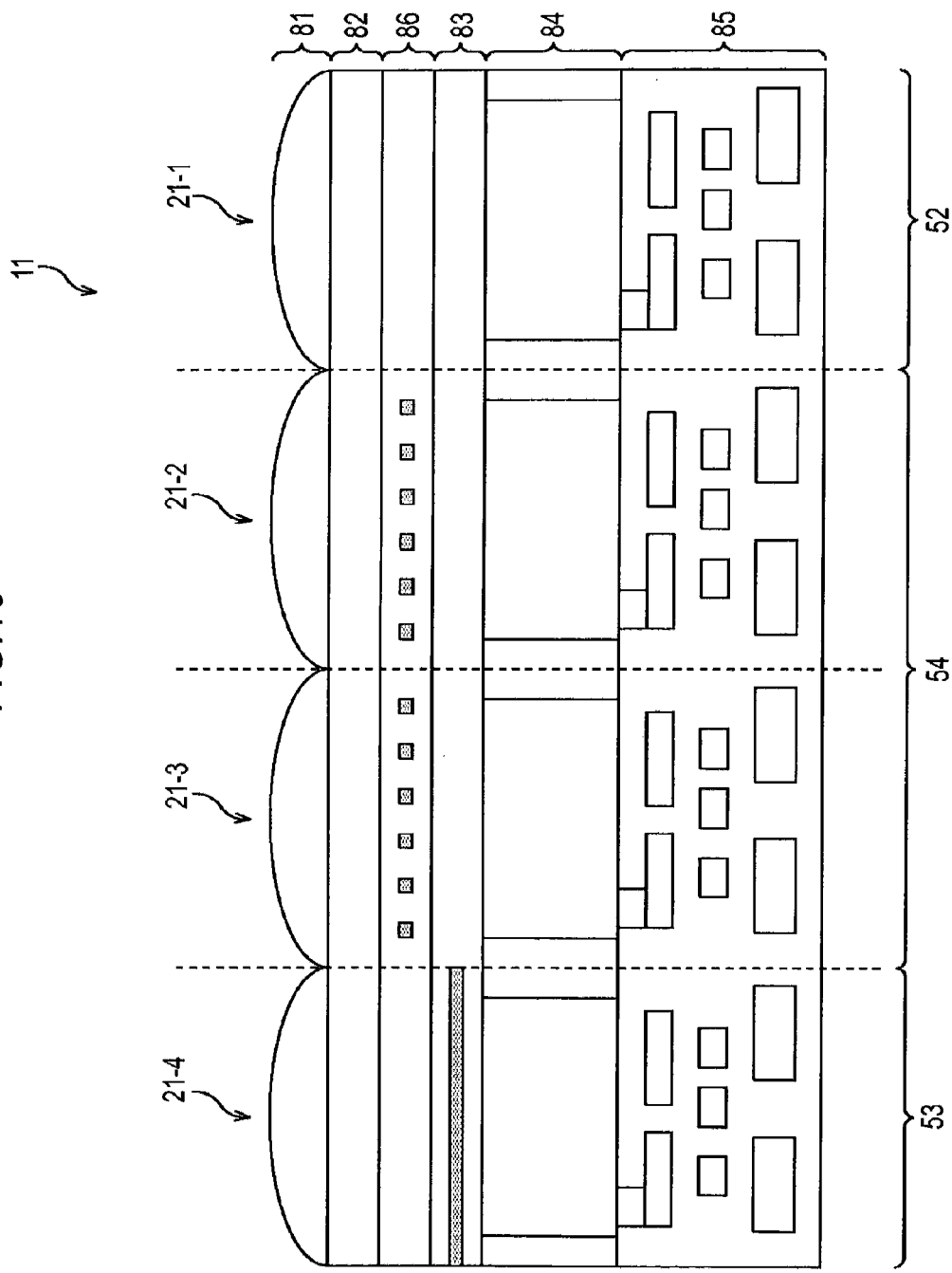
FIG. 13 is a cross-sectional schematic view of an imaging device.

Next, FIG. 13 is a cross-sectional schematic view of another example of a configuration of the imaging device 11.

In FIG. 13, the imaging device 11 has a configuration in which the pixels 21-1 of the imaging area 52, the pixels 21-2 and 21-3 of the spectrum area 54, and the pixel 21-4 of the optical black area 53 are adjacently provided. In FIG. 13, an example of a configuration employing a back-side irradiation CMOS-type solid-state imaging device is shown as the imaging device 11. However, a configuration in which a photoelectric conversion device portion is the CCD-type solid-state imaging device, or a photoconductor structure including an organic photoelectric conversion film or a quantum dot structure may be employed.

The pixels 21-1 to 21-4 are configured by laminating an on-chip micro lens 81, a color filter layer 82, a conductive particle layer 86, a light shield area layer 83, a photoelectric conversion device layer 84, and a signal line layer 85 in order from the upside.

The on-chip micro lens 81 is an optical device for collecting light on the photoelectric conversion device layer 84 of the pixels 21-1 to 21-4. The color filter layer 82 is an optical device for obtaining a color image by the pixel 21-1 in the imaging area 52.

The light shield area layer 83 has a dielectric material having a light shielding property such as aluminum or tungsten. In the optical black area 53, the whole opening portion of the pixel 21-4 is shielded by the light shield area layer 83. The conductive particle layer 86 has a configuration in which dielectric materials are arranged in the hole array structure or the island array structure described above in the spectrum area 54, and serves as a plasmon filter. That is, in the example of the configuration shown in FIG. 12, the light shield area layer 83 is provided with a function as the plasmon filter. However, as shown in the example of the configuration of FIG. 13, the conductive particle layer 86 having the function of the plasmon filter may be provided separately from the light shield area layer 83.

The photoelectric conversion device layer 84 converts the received light into charges. The photoelectric conversion device layer 84 has a configuration in which the pixels 21-1 to 21-4 are electrically separated by a device separating layer. On the signal line layer 85, lines for reading the charges accumulated in the photoelectric conversion device layer 84 are provided.

As described above, in the imaging device 11, the conductive particle layer 86 has the function as the spectrum filter in the spectrum area 54, and a general imaging function may be realized in the other area. Accordingly, it is possible to easily realize a multi-function sensor.

In the imaging device 11, since the imaging area 52 and the spectrum area 54 are provided in a single chip, the spectrum function of acquiring the color spectrum can be realized with a simple structure, in addition to a general color imaging function. Accordingly, the imaging device 11 can be inexpensively produced as compared with the case of providing a sensor only for spectrum.

Since the plasmon filter is employed as the color filter provided in the spectrum area 54, it is possible to acquire more kinds of color spectrum than the imaging area 52 only by adjusting the pitch.

Figure 14:
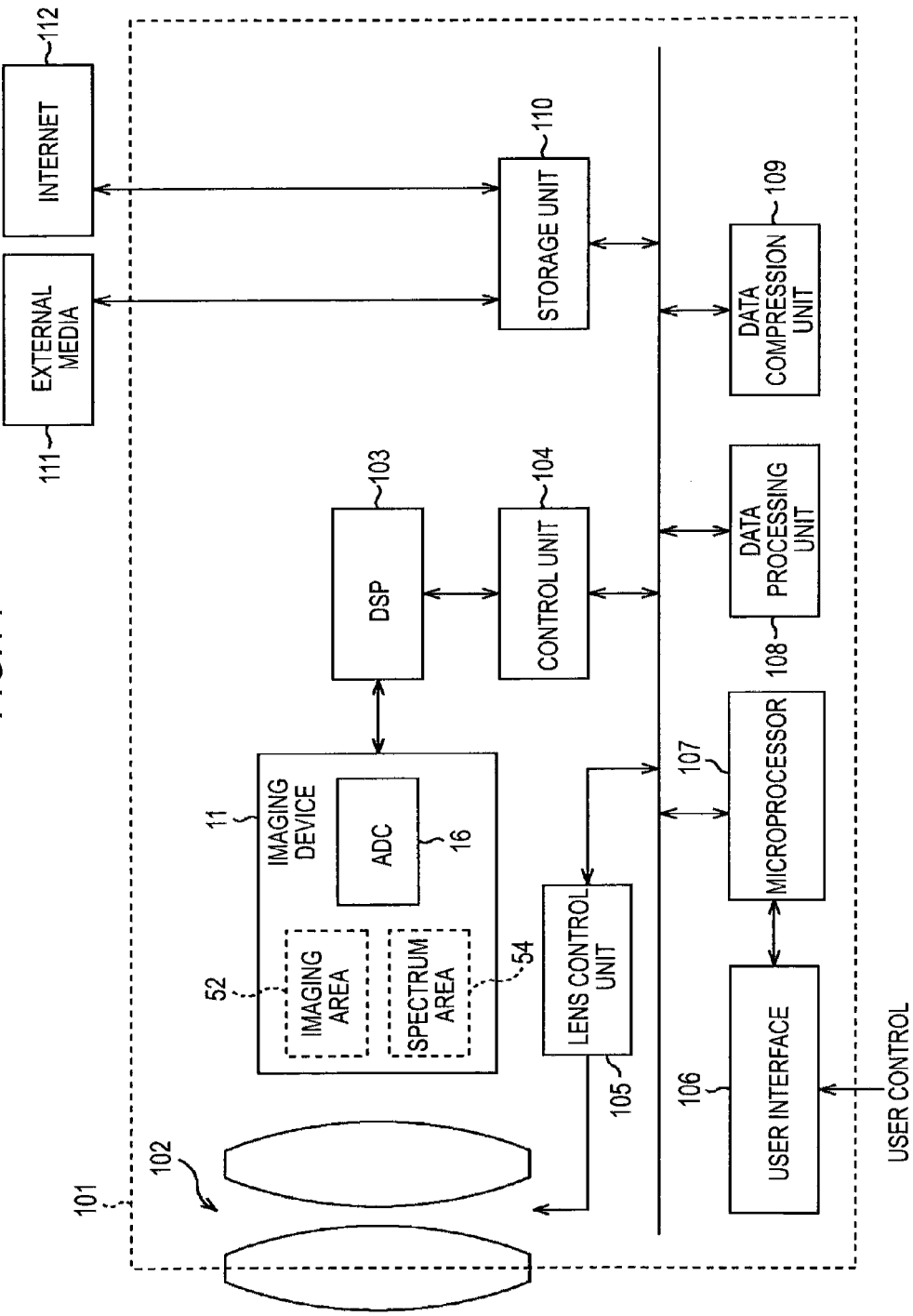
FIG. 14 is a block diagram illustrating an example of a configuration of an imaging apparatus provided with an image device.

Next, FIG. 14 is a block diagram illustrating an example of a configuration of an imaging apparatus (digital still camera) provided with the imaging device 11.

In FIG. 14, the imaging apparatus 101 includes the imaging device 11, a lens unit 102, a DSP (Digital Signal Processor) 103, a control unit 104, a lens control unit 105, a user interface 106, a microprocessor 107, a data processing unit 108, a data compression unit 109, and a storage unit 110.

As shown in FIG. 3, the imaging device 11 has the imaging area 52 and the spectrum area 54, and the light (optical information) collected through the lens unit 102 is converted into a charge signal by the photoelectric conversion device of each pixel 21 in the imaging area 52 and the spectrum area 54. The pixel signal output from each pixel 21 is converted into a digital signal value corresponding to light receiving intensity by the column ADC circuit 16 (FIG. 1), and is output as pixel data.

The lens unit 102 has a plurality of lens groups such as a zoom lens and an image forming lens, and collects the light (image information and spectrum information) from a photography subject (not shown) on the light receiving face of the imaging device 11.

The DSP 103 performs a signal process on the pixel data output from the imaging device 11 to form an image, and supplies the image data to the control unit 104.

The control unit 104 controls the blocks of the imaging apparatus 101. For example, it is assumed that a control signal representing a user operating a shutter button (not shown) is supplied to the control unit 104 through the user interface 106 and the microprocessor 107. In this case, the control unit 104 supplies the image data output from the DSP 103 according to the control of the user to the data processing unit 108 to be subjected to a data process, the data is supplied to the data compression unit 109 and is compressed, and then the data is supplied to and stored in the storage unit 110.

For example, when a control signal representing that the user operates a zoom lever (not shown) is supplied to the lens control unit through the user interface 108 and the microprocessor 107, the lens control unit 105 drives the lens unit 102 to adjust a zoom magnification according to the control of the user. The lens control unit 105 drives the lens unit 102 according to the control of the control unit 104, and shifts a focus from the light receiving face of the imaging device 11 to be an unfocused state (defocus or off-focus).

When the user operates an operation unit (not shown), the user interface 106 acquires a control signal according to the operation of the user, and supplies the control signal to the microprocessor 107. The microprocessor 107 supplies the control signal output from the user interface 106, to a block suitable for the control.

The data processing unit 108 performs a data process such as removal of noises on the image data output from the DSP 103. The data compression unit 109 performs a compression process based on JPEG or MPEG on the image data subjected to the data process by the data processing unit 108.

The storage unit 110 has a memory unit such as a flash memory (e.g., EEPROM (Electronically Erasable and Programmable Read Only Memory)), and stores the image data subjected to the compression process by the data compression unit 109. The image data stored in the storage unit 110 may be transmitted to an external media 111 through a drive (not shown), and may be uploaded to the Internet 112. through a communication unit (not shown).

The imaging apparatus 101 with such a configuration has an imaging mode of taking an image, and a spectrum mode of acquiring color spectrum.

In the imaging mode, the pixel data output from the imaging device 11 is appropriately subjected to image correction based on demosaicing, γ correction, white balance adjustment, and the like by the DSP 103, and then is stored as a raw image (RAW) or a compressed image in the storage unit 110.

In the spectrum mode, the pixel data (1-dimensional spectrum or 2-dimensional spectrum map) output from the imaging device 11 is subjected to a process such as color spectrum restoration based on a deconvolution process in the DSP 103, and then is stored as raw data or compressed data in the storage unit 110.

In the imaging apparatus 101, a process of acquiring a calibration table for calibrating a color filter of the imaging area 52, a process of acquiring spectrum in the off-focus in which the space resolution is not necessary, and a process of acquiring a high-precision 2-dimensional color spectrum map using the spectrum area 54 as a linear sensor, are performed using the data acquired from the spectrum area 54 of the imaging device 11.

Figure 15:
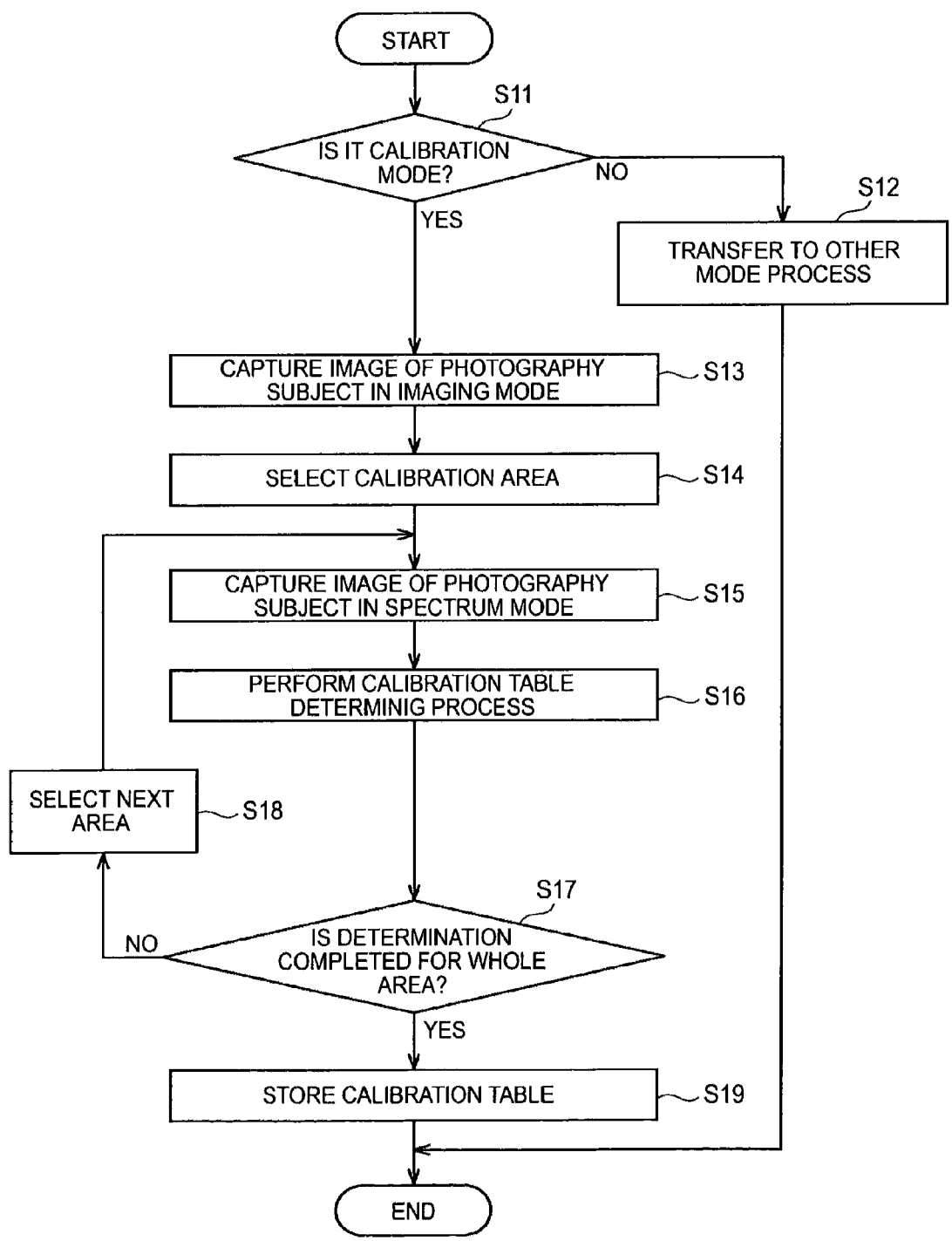
FIG. 15 is a flowchart illustrating a process of acquiring a calibration table.

Next, FIG. 15 is a flowchart illustrating the process of acquiring the calibration table for calibrating the color filter of the imaging area 52.

In Step S11, the control unit 104 of the imaging apparatus 101 determines whether or not a mode is the mode (calibration mode) of acquiring the calibration table. When the control unit 104 determines that the mode is not calibration mode, the process proceeds to Step S12 and transfers to the other mode process, and the process is ended. Meanwhile, when the control unit 104 determines that the mode is the calibration mode, the process proceeds to Step S13.

In Step S13, the control unit 104 controls the imaging device 11 to take an image of a photography subject in the imaging mode, and the imaging device 11 outputs the pixel data corresponding to the amount of charges accumulated in the pixels 21 of the imaging area 52 to the DSP 103. The control unit 104 acquires the image obtainable in the imaging mode through the DSP 103, and the process proceeds to Step S14.

In Step S14, the control unit 104 selects a calibration area for performing calibration, from the image acquired in Step S13.

After processing Step S14, the process proceeds to Step S15, the control unit 104 controls the imaging device 11 to take an image of the photography subject in the spectrum mode. The imaging device 11 supplies the pixel data corresponding to the amount of charges accumulated in the pixels 21 of the spectrum area 54 to the control unit 104 through the DSP 103, and the process proceeds to Step S16.

In Step S16, the control unit 104 performs a constituent table determining process of determining a constituent table for calibrating the color filter of the calibration area selected in Step S14, on the basis of the pixel data acquired in Step S15.

In Step S17, the control unit 104 determines whether or not the determination of the constituent table in the entire area is completed. In Step S17, when the control unit 104 determines that the determination of the constituent table in the whole area is not completed, that is, when a calibration area for which the calibration table is not determined remains, the process proceeds to Step S18, the next correction area is selected, the process returns to Step S15, and the following processes are repeated.

In Step S17, when the control unit 104 determines that the determination of the constituent table in the entire area is completed, the process proceeds to Step S19.

In Step S19, the control unit 104 stores the constituent table in a storage unit (not shown) built therein, and the process is ended.

As described above, the imaging apparatus 101 acquires the calibration table for calibrating the color filter of the imaging area 52 using the data acquired by the spectrum area 54. Accordingly, in the imaging apparatus 101, an influence such as decoloration and deterioration of the color filter of the imaging area 52 is corrected, and it is possible to suppress a decrease of image quality of the acquired image.

That is, the color filter of the imaging area 52 contains organic molecules such as pigment, and thus may deteriorate by the influence of ultraviolet ray or the like, but the plasmon filter 61 of the spectrum area 54 has durability against external stimulus such as the ultraviolet ray, and such deterioration does not occur. Accordingly, it is possible to obtain the accurate spectrum data using the spectrum area 54, and thus it is possible to correct interannual deterioration of color characteristics of the imaging area 52. In addition, since it is possible to apply the gain optimized for each color to the calculation process of the captured image on the basis of the color information of the spectrum area 54, it is possible to effectively utilize the range of the AD conversion.

Figure 16:
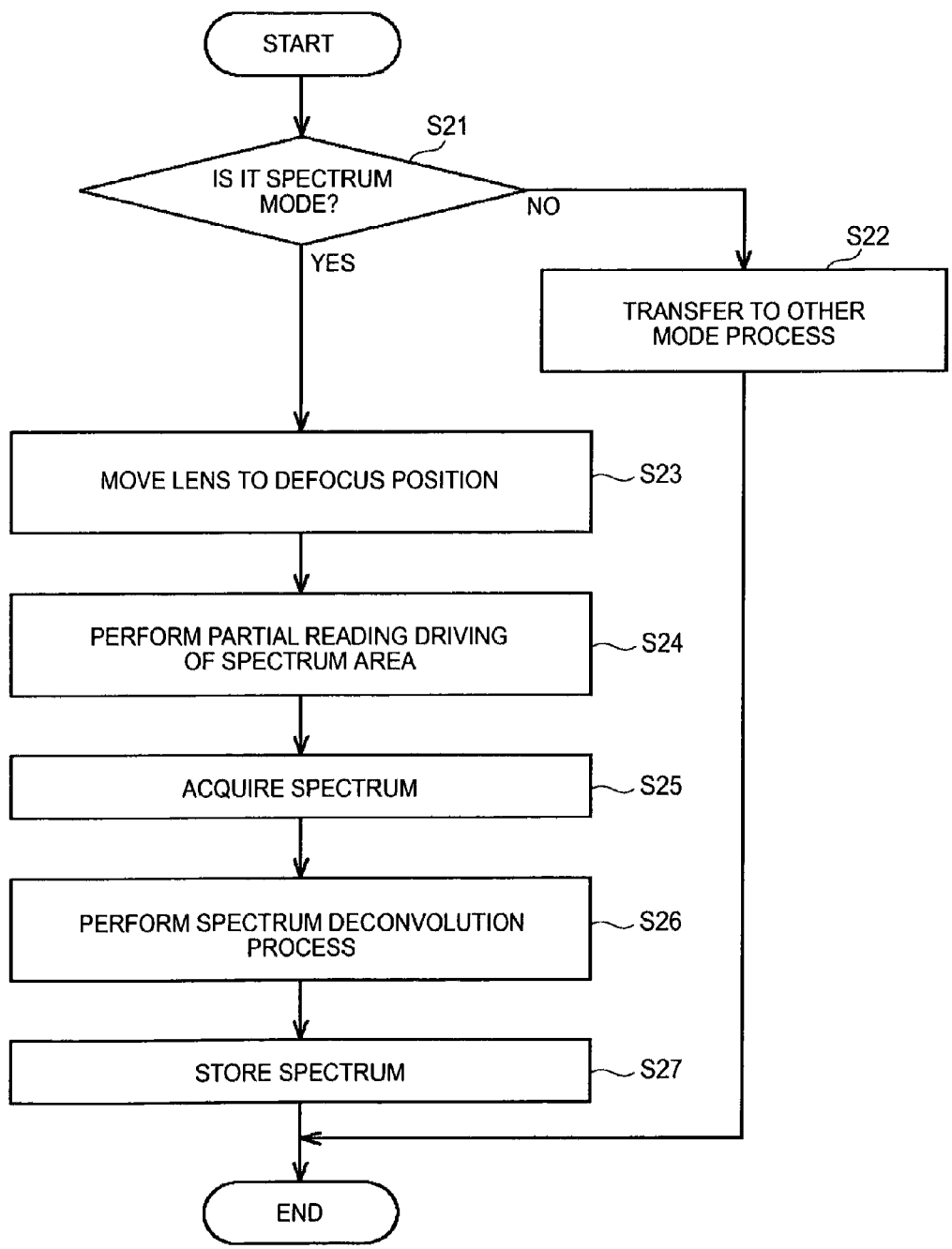
FIG. 16 is a flowchart illustrating a process of acquiring spectrum in off-focus.

Next, FIG. 16 is a flowchart illustrating a process of acquiring spectrum in the off-focus in which the space resolution is not necessary.

In Step S21, the control unit 104 of the imaging apparatus 101 determines whether or not a mode is a mode (spectrum mode) of acquiring the spectrum. When the control unit 104 determines that the mode is not the spectrum mode, the process proceeds to Step S22 and transfers to the other mode process, and the process is ended. Meanwhile, when the control unit 104 determines that the mode is the spectrum mode, the process proceeds to Step S23.

In Step S23, the control unit 104 controls the lens control unit 105 to move the lens unit 102 to the defocus position. Accordingly, the lens control unit 105 adjusts a position of the image forming lens of the lens unit 102 to move and defocus the position of the image of the photography subject, an image of which is formed by the lens unit 102, from the light receiving face of the imaging device 11.

After processing Step S23, the process proceeds to Step S24, the control unit 104 controls the imaging device 11 to perform reading to output the pixel data from the pixels 21 of the spectrum area 54 of the imaging device 11. Accordingly, the control unit 104 acquires the pixel data in the state where the image is gradational, and the process proceeds to Step S25.

In Step S25, the control unit 104 acquires the spectrum on the basis of the pixel data acquired in Step S24, and performs a deconvolution process on the spectrum in Step S26. In Step S27, the control unit 104 stores the spectrum subjected to the deconvolution process in Step S26, in the storage unit built therein, and the process is ended.

As described above, since the imaging apparatus 101 acquires the spectrum on the basis of the pixel data output from the spectrum area 54 in the defocus state, it is possible to acquire the accurate color information of the photography subject with enlargement by the spectrum.

Figure 17:
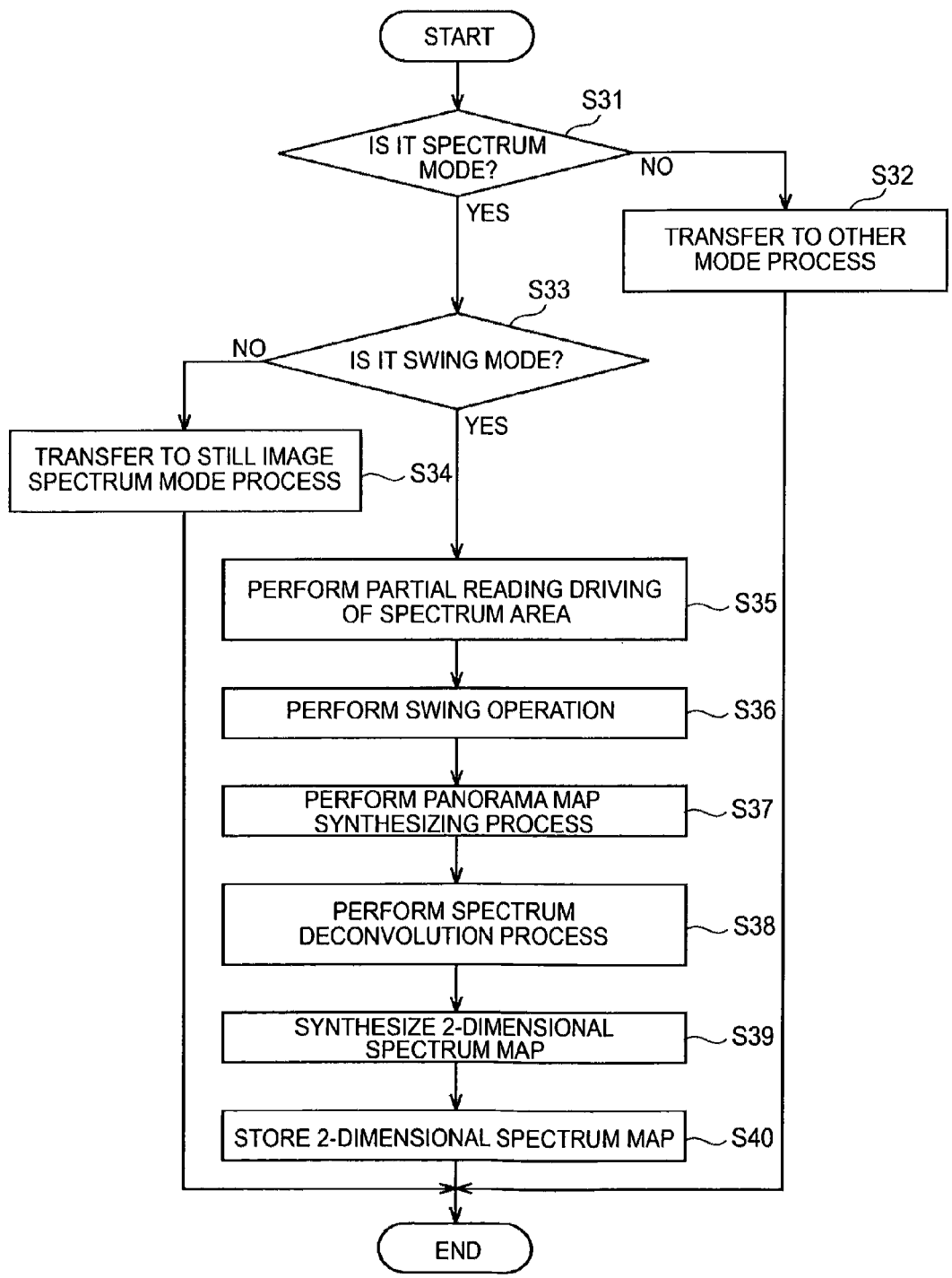
FIG. 17 is a flowchart illustrating a process of acquiring a high-precision 2-dimensional color spectrum map.

Next, FIG. 17 is a flowchart illustrating a process of acquiring a high-precision 2-dimensional spectrum map using the spectrum area 54 as a linear sensor.

In Step S31, the control unit 104 of the imaging apparatus 101 determines whether or not a mode is the mode (spectrum mode) of acquiring the spectrum. When the control unit 104 determines that the mode is not the spectrum mode, the process proceeds to Step S32 and transfers to the other mode process, and the process is ended. Meanwhile, when the control unit 104 determines that the mode is the spectrum mode, the process proceeds to Step S33.

In Step S33, the control unit 104 determines whether or not the imaging mode of the imaging apparatus 101 is a swing mode. When the control unit 104 determines that the mode is not the swing mode, the process proceeds to Step S34 and transfers to a still image spectrum mode process (FIG. 16), and the process is ended. Meanwhile, when the control unit 104 determines that the imaging mode of the imaging apparatus 101 is the swing mode, the process proceeds to Step S35.

In Step S35, the control unit 104 controls the imaging device 11 to perform reading to output the pixel data from the pixels 21 of the spectrum area 54 of the imaging device 11, and the process proceeds to Step S36.

In Step S36, the control unit 104 waits for a swing operation of the imaging apparatus 101 by the user. For example, when the swing operation is detected by an acceleration sensor (not shown), the pixel data sequentially output from the spectrum area 54 of the imaging device 11 during the swing is sequentially stored. When the swing operation is ended, the process proceeds to Step S37.

In Step S37, the control unit 104 supplies the pixel data acquired in Step S36 to the data processing unit 108, and performs a data process of synthesizing panorama maps arranged according to the swing (parallel movement) of the image apparatus 101 on the pixel data acquired during the swing. The data processing unit 108 supplies the 2-dimensional spectrum obtainable by performing the panorama map synthesizing process to the control unit 104, and the process proceeds to Step S38.

In Step S38, the control unit 104 performs a deconvolution process on the spectrum supplied from the data processing unit 108, and synthesizes the 2-dimensional spectrum maps in Step S39.

In Step S40, the control unit 104 stores the 2-dimensional spectrum map acquired in Step S39, in the storage unit (not shown) built therein, and the process is ended.

As described above, in the imaging device 101, it is possible to use the spectrum area 54 as the linear sensor by the active swing of the user, and thus it is possible to acquire the high-precision 2-dimensional color spectrum map. That is, since the spectrum area 54 of the imaging device 11 obtains minute resolution, the space resolution of the spectrum map obtainable in the stationary state decreases as compared with the 2-dimensional imaging device in which the Bayer arrangement or the like is the general number of colors. However, it is possible to use the spectrum area 54 as the linear sensor by the swing of the imaging apparatus 101. Accordingly, it is possible to acquire a higher-precision spectrum map than the spectrum map obtainable in the stationary state, by arranging the pixel data according to the swing of the imaging apparatus 101.

For example, even in a rectangular spectrum area (e.g., X=50 pixels and Y=3000 pixels) in which transverse color filters of 50 pixels are longitudinally arranged in one column, it is possible to acquire a 2-dimensional image of 50 sheets (50 colors) by swinging the imaging apparatus.

In addition, it is possible to obtain space spectrum mapping data by acquiring such a 2-dimensional spectrum map. For example, in the captured images, it is possible to cut a specific color spectrum area of the photography subject.

More specifically, in the imaging apparatus 101, it is possible to robustly extract a photography subject having a specific wavelength profile using the spectrum data. For example, there is a specific decrease in the reflective index in 970 nm light on the human skin. Accordingly, it is possible to robustly detect a delicate difference in color in flesh color invisible to the naked eye from an intensity ratio of incident 970 nm light and incident light of the other wavelength, and thus it is possible to realize a high-precision human feeling sensor.

The spectrum sensor function may be applied to wide-field intelligent cameras for beauty or health management, for example, stained locations or unevenness in suntan distribution can be viewed from the image obtained by taking an image of a user's face.

In addition, it is possible to apply the spectrum sensor function to various fields by extracting delicate differences in color spectrum invisible to the human eye, or characteristics of specific color spectrum in substances, for example, appraisement of real or not between plants and foliage plants, or estimation of freshness.

In addition, such a high-precision spectrum sensor can be applied to intelligent cameras for security, games, face detection, motion detection, and the like.

Next, a method of producing the imaging device 11 having the spectrum area 54 provided with the spectrum filter using the plasmon resonator will be described.

First, an insulating layer is produced on a light receiving face layer that is a substrate, and the whole face is coated with a metal layer formed of aluminum on the insulating film by sputtering method (Physical Vapor Deposition (PVD)). Then, a photomask is coated on the whole-coated metal layer. A positive type resist may be employed as the photomask, and the resist is applied and baked.

A conductive pattern corresponding to a plasmon resonator is transferred to the resist of the spectrum area 54 by reduced reflective exposure. In the transfer of the conductive pattern, lithography using ArF (argon fluoride) laser, F2 excimer laser, extreme ultraviolet lithography (EUVL), electron projection lithography, X-ray lithography, and the like suitable for a high-resolution process is highly preferable. In addition, electron lithography of directly drawing with electron may be used.

Thereafter, an unnecessary metal area is removed by reactive ion etching, and thus a plasmon resonator structure based on a desired conductive pattern is realized.

By such a production method, it is possible to produce the imaging device 11 having the spectrum area 54 provided with the spectrum filter using the plasmon resonator.

In addition, as the other process methods, a minute method may be employed in which a minute process is performed by a heat cycle nanoimprint method or an optical nanoimprint method, a groove portion formed by the minute process is filled with a metal layer, and a surface is polished.

As long as the imaging device 11 having the spectrum area 54 can be realized with high precision, the production method is not limited to the above-described methods. In the production method, although the method of mounting the spectrum filter using the plasmon resonator using aluminum used as the signal line layer or the light shield film by the process of producing the general CMOS-type solid-state imaging device is described, a conductor other than aluminum, for example, silver or the like, may be used.

In addition, the light shield area (e.g., the area where the optical black area 53 is covered with the light shield area 83 shown in FIG. 12) is realized by providing no periodic opening based on the conductive pattern, but it is the related structure, and thus the detailed description is omitted.

Figure 8B:
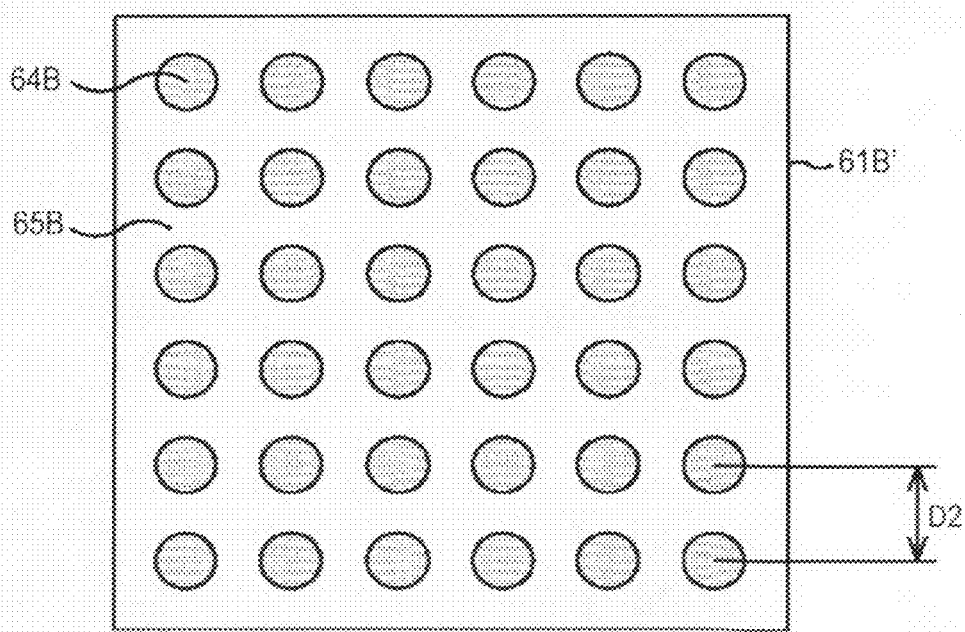

In the specification, the plasmon resonator includes the conductive metal structure in which the holes (the through-holes 63A and 63B) are formed at a predetermined pitch by the minute process as shown in FIGS. 6A and 6B, the conductive metal structure in which the holes (the through-holes 63C and the non-through-holes 63C') are formed at a predetermined pitch by the minute process as shown in FIG. 6C, and the structure in which the conductive metal particles (the islands 64A and 64B) are formed at a predetermined pitch by the minute process as shown in FIGS. 8A and 8B, and they are referred to as a conductive metal structure having an unevenness structure at a predetermined pitch. That is, it is preferable that the plasmon resonator have a pattern structure in which holes or islands are repeatedly arranged at a predetermined pitch. In addition, the plasmon resonator may have a configuration, for example, in which holes or islands are 1-dimensionally (linearly) arranged, in addition to the configuration in which the holes and islands are 2-dimensionally arranged.

The plasmon resonator structure has a basic structure in which a conductive thin film is provided on the face of the pixel 21 that is an optical detection device of the imaging device 11 through an insulating layer formed of a silicon oxide film or a silicon nitride film. The optical detection device is not limited to the CMOS-type solid-state imaging device. The CCD-type solid-state imaging device may be used, and it is natural that any device having the photoelectric conversion function may be employed. The structure and the production method of the photoelectric conversion device are the related art, and thus the detailed description is omitted.

The present disclosure may be applied to a camcorder or an information terminal apparatus provided with an imaging device, in addition to the imaging apparatus 101. The plasmon filter may be employed as the color filter provided in the imaging area.

The embodiments of the present disclosure are not limited to the above-described embodiment, and may be variously modified within the scope of the concept of the present disclosure.

The present disclosure contains subject matter related to that disclosed in Japanese Priority Patent Application JP 2010-200733 filed in the Japan Patent Office on Sep. 8, 2010, the entire content of which is hereby incorporated by reference.

What is claimed is:

1. An imaging device comprising:
an imaging area in which a plurality of imaging pixels configured to acquire an image are provided;
a spectrum area in which a plurality of spectrum pixels configured to acquire a color spectrum are provided, the spectrum area located in a non-imaging area proximate to the imaging area, wherein the spectrum area completely surrounds the imaging area; and
a filter that is formed above the spectrum pixels and allows an electromagnetic wave with a desired wavelength to pass,
wherein the filter is formed of a plasmon resonator that is a conductive metal structure having an unevenness structure at a predetermined pitch, and the imaging area and the spectrum area are provided on a single chip.

2. The imaging device according to claim 1, further comprising an optical black area in which optical black pixels configured to output a pixel signal used for regulation of a black level are provided when acquiring the image from pixel signals output from the imaging pixels of the imaging area, and
wherein the plasmon resonator constituting the filter of the spectrum area and a light shield film formed above the optical black area are mounted on a same layer with a same material.

3. The imaging device according to claim 1, wherein the spectrum area is provided in a part of an area surrounding an outer periphery of the imaging area.

4. The imaging device according to claim 1, wherein the plasmon resonator constituting the filter of the spectrum area is formed in such a manner that holes having a diameter smaller than an effective detection electromagnetic wavelength in a medium are 2-dimensionally arranged in a conductive metal thin film in which a plasma frequency is in an ultraviolet wavelength band at a pitch equal to or less than the detection electromagnetic wavelength.

5. The imaging device according to claim 1, wherein the plasmon resonator constituting the filter of the spectrum area is formed in such a manner that conductive metal particles having a diameter smaller than an effective detection electromagnetic wavelength in a medium and in which a plasma frequency is in an ultraviolet wavelength band are 2-dimensionally arranged in a layer formed of a dielectric at a pitch equal to or less than the detection electromagnetic wavelength.

6. The imaging device according to claim 1, wherein the plasmon resonator constituting the filter of the spectrum area constitutes filter units for each kind of passing electromagnetic wavelengths, one filter unit has an area wider than that of a spectrum pixel, and the filter units are arranged corresponding to N×M (N and M are respective integers equal to or more than 1) pixels.

7. The imaging device according to claim 1, wherein a photoelectric conversion device of the imaging pixel and/or spectrum pixel is a CMOS (Complementary Metal Oxide Semiconductor) type or a CCD (Charge Coupled Device) type.

8. The imaging device according to claim 1, wherein the spectrum area is directly adjacent the imaging area.

9. An imaging apparatus comprising:
an imaging device including
an imaging area in which a plurality of imaging pixels configured to acquire an image are provided,
a spectrum area in which a plurality of spectrum pixels configured to acquire a color spectrum are provided, the spectrum area located in a non-imaging area proximate to the imaging area, wherein the spectrum area completely surrounds the imaging area, and
a filter that is formed above the spectrum pixels and allows an electromagnetic wave with a desired wavelength to pass,
wherein the filter is formed of a plasmon resonator that is a conductive metal structure having an unevenness structure at a predetermined pitch, and the imaging area and the spectrum area are provided on a single chip.

10. The imaging apparatus according to claim 9, further comprising a calibration information acquiring element configured to perform a process of acquiring calibration information used for calibration of a color of the image acquired using the imaging area on the basis of color spectrum information of a photography subject acquired in the spectrum area.

11. The imaging apparatus according to claim 9, further comprising a color spectrum information acquiring element configured to perform a process of acquiring color spectrum information of a photography subject acquired in the spectrum area when a light receiving face of the imaging device is in an unfocused state.

12. The imaging apparatus according to claim 9, further comprising a 2-dimensional color spectrum information acquiring element configured to sequentially acquire color spectrum information of a photography subject acquired in the spectrum area according to parallel movement, and to perform a process of 2-dimensionally acquiring the color spectrum information of the photography subject.

13. The imaging apparatus according to claim 9, further comprising a lens unit, wherein the lens unit is configured to provide light to both the imaging area and the spectrum area.

14. The imaging apparatus according to claim 9, wherein the spectrum area is directly adjacent the imaging area.

* * * * *